US012787890B2

(12) United States Patent
Jung et al.

(10) Patent No.: US 12,787,890 B2
(45) Date of Patent: Nov. 3, 2026

(54) DISPLAY DEVICE AND TILED DISPLAY DEVICE INCLUDING THE SAME

(71) Applicant: Samsung Display Co., LTD., Yongin-si (KR)

(72) Inventors: Min Sik Jung, Yongin-si (KR); Min Hyuck Park, Yongin-si (KR); Yong Duck Son, Yongin-si (KR); Hoon Lee, Yongin-si (KR); Nak Cho Choi, Yongin-si (KR); Jae Chil Hwang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 279 days.

(21) Appl. No.: 18/652,638

(22) Filed: May 1, 2024

(65) Prior Publication Data

US 2024/0387479 A1 Nov. 21, 2024

(30) Foreign Application Priority Data

May 16, 2023 (KR) ........................ 10-2023-0063011
Feb. 1, 2024 (KR) ........................ 10-2024-0016045

(51) Int. Cl.
*H10W 90/00* (2026.01)

(52) U.S. Cl.
CPC .................................. *H10W 90/00* (2026.01)

(58) Field of Classification Search
CPC ...... H10W 90/00; G09F 9/302; G09F 9/3026; G09F 9/33; H10H 29/14; H10H 29/10; H10H 29/012
See application file for complete search history.

(56) References Cited

U.S. PATENT DOCUMENTS 10,403,612 B2 9/2019 Lo et al.
11,239,122 B2 2/2022 Jung et al.
(Continued)

FOREIGN PATENT DOCUMENTS

CN 102169885 A 8/2011
CN 103730478 A 4/2014
(Continued)

OTHER PUBLICATIONS

Chinese Office Action dated Jul. 26, 2024 issued in corresponding Chinese Patent Application No. 202080098020.0 (8 pages).

*Primary Examiner* — Mohammad A Rahman
(74) *Attorney, Agent, or Firm* — Womble Bond Dickinson (US) LLP

(57) ABSTRACT

A display device includes: a substrate; a light-emitting element on a first surface of the substrate; a driver on a second surface of the substrate opposite to the first surface, and configured to drive the light-emitting element; a first pad on the first surface of the substrate, and electrically connected to the light-emitting element; a second pad on the second surface of the substrate, and electrically connected to the driver; side surface lines on a side surface of the substrate that is between the first surface and the second surface of the substrate, the side surface lines to electrically connect the first pad to the second pad; and an overcoat layer on the side surface of the substrate, and on the side surface lines, a thickness of a region not overlapping a side surface line is greater than a thickness of a region overlapping the side surface line.

21 Claims, 23 Drawing Sheets

(56) References Cited

U.S. PATENT DOCUMENTS

| | | | |
|---|---|---|---|
| 11,594,456 B2 | 2/2023 | Jung et al. | |
| 11,984,547 B2 | 5/2024 | Shimizu | |
| 2011/0186876 A1 | 8/2011 | Suzuki et al. | |
| 2012/0181504 A1 | 7/2012 | Takagi et al. | |
| 2021/0272938 A1 | 9/2021 | Chang et al. | |
| 2023/0237937 A1 * | 7/2023 | Choi | G09F 9/3026 257/79 |
| 2024/0266362 A1 | 8/2024 | Choi et al. | |

FOREIGN PATENT DOCUMENTS

| | | | |
|---|---|---|---|
| CN | 107680989 | A | 2/2018 |
| JP | 2008-091755 | A | 4/2008 |
| JP | 7034235 | B2 | 3/2022 |
| JP | 2023-057554 | A | 4/2023 |
| KR | 2019-0044016 | A | 4/2019 |
| KR | 2020-0010685 | | 1/2020 |
| KR | 10-2020-0076581 | A | 6/2020 |
| KR | 10-2344277 | B1 | 12/2021 |
| KR | 2022-0021880 | A | 2/2022 |
| KR | 2022-0021884 | A | 2/2022 |
| KR | 2024-0122619 | A | 8/2024 |
| WO | WO 2018-117680 | A2 | 6/2018 |

* cited by examiner

DISPLAY DEVICE AND TILED DISPLAY DEVICE INCLUDING THE SAME

CROSS-REFERENCE TO RELATED APPLICATION

The present application claims priority to and the benefit of Korean Patent Application No. 10-2023-0063011, filed on May 16, 2023, and Korean Patent Application No. 10-2024-0016045, filed on Feb. 1, 2024, in the Korean Intellectual Property Office, the entire disclosure of each of which is incorporated by reference herein.

BACKGROUND

1. Field

The present disclosure relates to a display device and a tiled display device including the same.

2. Description of the Related Art

The importance of display devices has steadily increased with the development of multimedia technology. In response thereto, various types of display devices such as an organic light-emitting diode (OLED) display, a liquid crystal display (LCD) and the like have been used.

The display device includes a display area configured to display various colors of light and/or images while being driven in units of pixels or sub-pixels, and a bezel area in which lines for driving the pixels or the sub-pixels are located.

In recent years, there has been an increasing demand for a bezel-less technique that reduces or removes the bezel area to increase or maximize the display area in the display device. Accordingly, research and development have been conducted on a side surface line forming technique that forms lines on a side surface of a substrate.

SUMMARY

Aspects of the present disclosure provide a display device capable of improving a driving failure by preventing or reducing damage to a side surface line, and a tiled display device including the same.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

In one or more embodiments, a display device including: a substrate; a light-emitting element on a first surface of the substrate; a driver on a second surface of the substrate opposite to the first surface, and configured to drive the light-emitting element; a first pad on the first surface of the substrate, and electrically connected to the light-emitting element; a second pad on the second surface of the substrate, and electrically connected to the driver; side surface lines on a side surface of the substrate that is between the first surface and the second surface of the substrate, the side surface lines being configured to electrically connect the first pad to the second pad; and an overcoat layer on the side surface of the substrate, and on the side surface lines, wherein, in the overcoat layer, a thickness of a region not overlapping a side surface line from among the side surface lines is greater than a thickness of a region overlapping the side surface line.

In one or more embodiments, the overcoat layer contacts the side surface of the substrate between the side surface lines, and contacts top and side surfaces of the side surface lines.

In one or more embodiments, the overcoat layer has a first thickness in the region not overlapping a side surface line from among the side surface lines, and has a second thickness that is less than the first thickness in the region overlapping the side surface line.

In one or more embodiments, the first thickness of the overcoat layer is a distance from the side surface of the substrate to a top surface of the overcoat layer, and the second thickness of the overcoat layer is a distance from a top surface of the side surface line to the top surface of the overcoat layer.

In one or more embodiments, the first thickness of the overcoat layer is greater than a sum of a thickness of the side surface line and the second thickness of the overcoat layer.

In one or more embodiments, a level difference of the overcoat layer is in a range of about 1 μm to about 10 μm, and wherein the level difference of the overcoat layer is a difference between the first thickness of the overcoat layer and a sum of a thickness of the side surface line and the second thickness of the overcoat layer.

In one or more embodiments, a distance from the side surface of the substrate to a top surface of the overcoat layer in the region not overlapping a side surface line from among the side surface lines is greater than a distance from the side surface of the substrate to the top surface of the overcoat layer in the region overlapping the side surface line.

In one or more embodiments, a distance from the side surface of the substrate to the top surface of the overcoat layer in the region not overlapping the side surface line is equal to a distance from the side surface of the substrate to the top surface of the overcoat layer in the region overlapping the side surface line.

In one or more embodiments, in the overcoat layer, the region not overlapping a side surface line from among the side surface lines protrudes more outwardly than the region overlapping the side surface line.

In one or more embodiments, the substrate further includes: a first chamfered surface extending from one side of the first surface; and a second chamfered surface extending from one side of the second surface, wherein the side surface connects the first chamfered surface to the second chamfered surface.

In one or more embodiments, a side surface line from among the side surface lines is on the first surface, the first chamfered surface, the side surface, the second chamfered surface, and the second surface.

In one or more embodiments, a side surface line from among the side surface lines includes silver (Ag).

In one or more embodiments, a display device including: a substrate; a light-emitting element on a first surface of the substrate; a driver on a second surface of the substrate opposite to the first surface, and configured to drive the light-emitting element; a first pad on the first surface of the substrate, and electrically connected to the light-emitting element; a second pad on the second surface of the substrate, and electrically connected to the driver; side surface lines on a side surface of the substrate between the first surface and the second surface of the substrate, the side surface lines being configured to electrically connect the first pad to the second pad; a first overcoat layer on the side surface of the substrate, and on the side surface lines; and a second overcoat layer on the first overcoat layer.

In one or more embodiments, a thickness of the first overcoat layer is greater than a thickness of a side surface line from among the side surface lines, and a top surface of the first overcoat layer is flat.

In one or more embodiments, the second overcoat layer includes a material that is different from a material of the first overcoat layer.

In one or more embodiments, the first overcoat layer includes a polyimide or polyacrylate resin.

In one or more embodiments, the second overcoat layer includes a black pigment and a filler, and wherein the first overcoat layer does not include the black pigment and the filler.

In one or more embodiments, a tiled display device including display devices and a seam between the display devices, wherein at least one display device from among the display devices includes: a substrate; a light-emitting element on a first surface of the substrate; a driver on a second surface of the substrate opposite to the first surface, and configured to drive the light-emitting element; a first pad on the first surface of the substrate, and electrically connected to the light-emitting element; a second pad on the second surface of the substrate, and electrically connected to the driver; side surface lines on a side surface of the substrate between the first surface and the second surface of the substrate, the side surface lines being configured to electrically connect the first pad to the second pad; and an overcoat layer on the side surface of the substrate, and on the side surface lines, wherein, in the overcoat layer, a thickness of a region not overlapping the side surface line is greater than a thickness of a region overlapping the side surface line.

In one or more embodiments, the light-emitting element includes a micro light-emitting diode of a flip chip type.

In one or more embodiments, the at least one display device further includes: a bottom surface connection line on the second surface of the substrate and connected to the second pad; and a flexible film connected to the bottom surface connection line through a conductive adhesive.

In one or more embodiments, the display devices are arranged in a matrix form in M rows and N columns, M and N being respective natural numbers.

In a display device and a tiled display device including the same according to one or more embodiments, an overcoat layer is formed to have a larger thickness at a region not overlapping a side surface line than at a region overlapping the side surface line, so that the likelihood that the side surface line is delaminated due to an external impact is reduced or prevented.

Further, in a display device and a tiled display device including the same according to one or more embodiments, the surface thereof is flattened by forming a first overcoat layer and a second overcoat layer, so that the likelihood that a side surface line is delaminated due to an external impact is reduced or prevented.

However, aspects according to the embodiments of the present disclosure are not limited to those described above and various other aspects are incorporated herein.

BRIEF DESCRIPTION OF THE DRAWINGS

The above and other aspects of the present disclosure will become more apparent by describing in detail embodiments thereof with reference to the attached drawings, in which.

DETAILED DESCRIPTION

Figure 1:
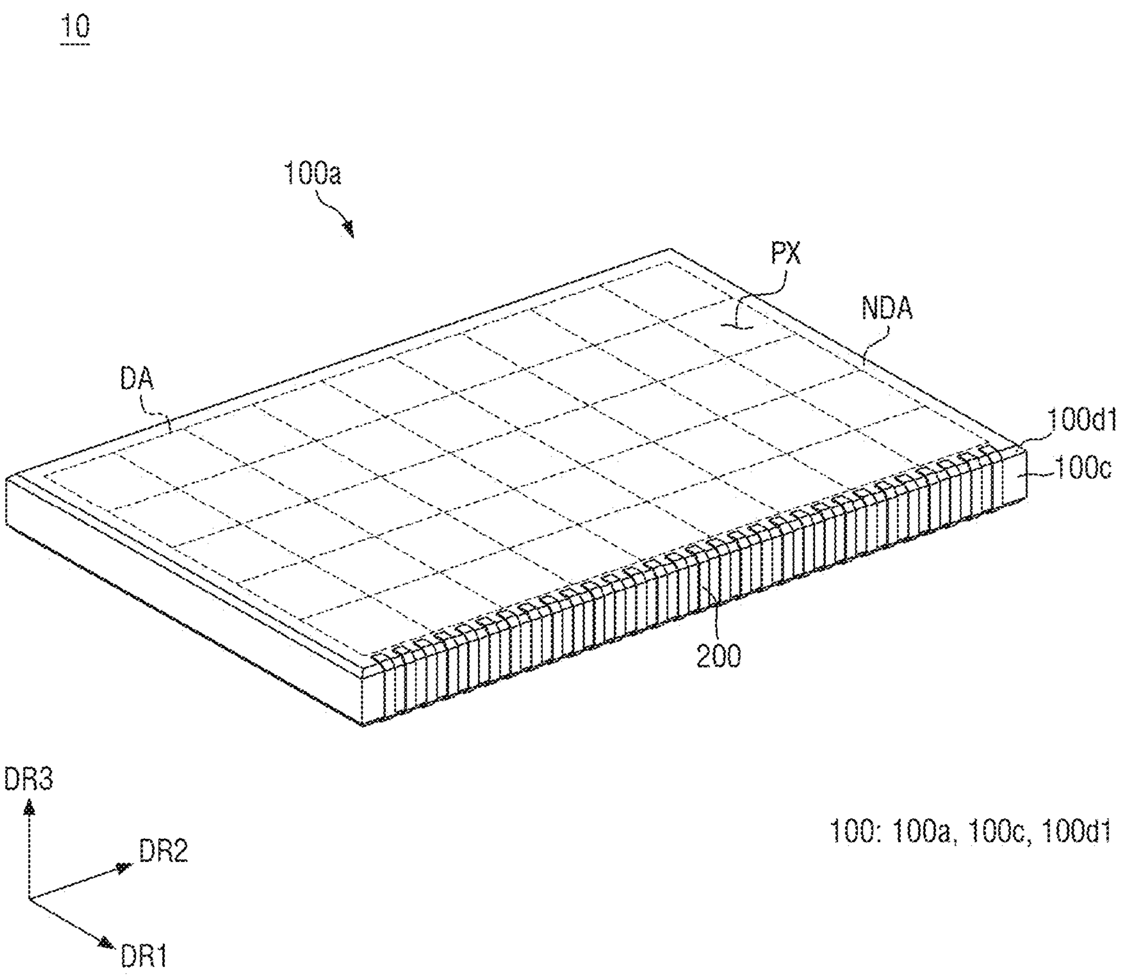
FIG. 1 is a perspective view showing a front surface of a display device according to one or more embodiments.

The present disclosure will now be described more fully hereinafter with reference to the accompanying drawings, in which embodiments of the present disclosure are shown. The present disclosure may, however, be embodied in different forms and should not be construed as limited to the embodiments set forth herein. Rather, these embodiments are provided so that the present disclosure will be thorough and complete, and will fully convey the scope of the present disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element.

Each of the features of the various embodiments of the present disclosure may be combined or combined with each other, in part or in whole, and technically various interlocking and driving are possible. Each embodiment may be implemented independently of each other or may be implemented together in an association.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

In some embodiments well-known structures and devices may be described in the accompanying drawings in relation to one or more functional blocks (e.g., block diagrams), units, and/or modules to avoid unnecessarily obscuring various embodiments. Those skilled in the art will understand that such block, unit, and/or module are/is physically implemented by a logic circuit, an individual component, a microprocessor, a hard wire circuit, a memory element, a line connection, and other electronic circuits. This may be formed using a semiconductor-based manufacturing technique or other manufacturing techniques. The block, unit, and/or module implemented by a microprocessor or other similar hardware may be programmed and controlled using software to perform various functions discussed herein, optionally may be driven by firmware and/or software. In addition, each block, unit, and/or module may be implemented by dedicated hardware, or a combination of dedicated hardware that performs some functions and a processor (for example, one or more programmed microprocessors and related circuits) that performs a function different from those of the dedicated hardware. In addition, in some embodiments, the block, unit, and/or module may be physically separated into two or more interact individual blocks, units, and/or modules without departing from the scope of the present disclosure. In addition, in some embodiments, the block, unit and/or module may be physically combined into more complex blocks, units, and/or modules without departing from the scope of the present disclosure.

Hereinafter, embodiments will be described with reference to the accompanying drawings.

Figure 2:
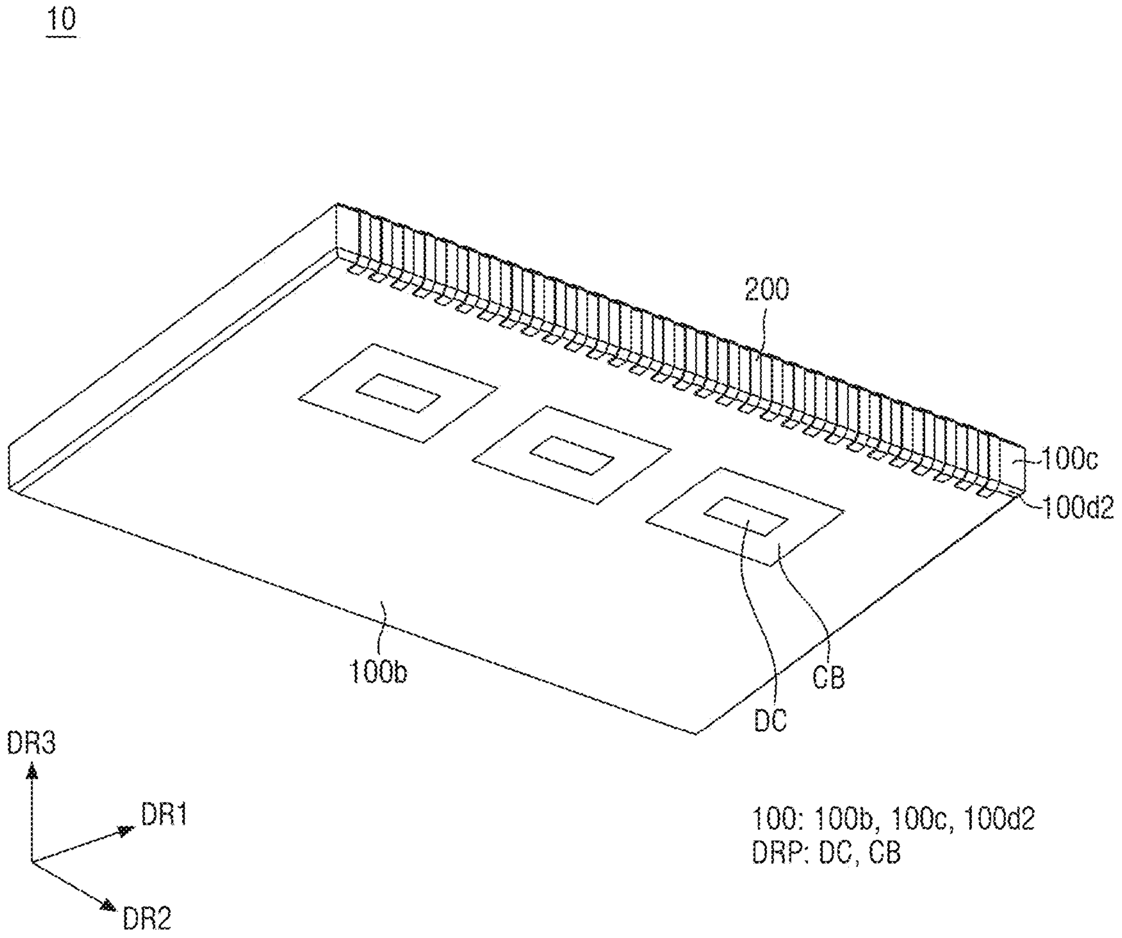
FIG. 2 is a perspective view showing a rear surface of a display device according to one or more embodiments.

FIG. 1 is a perspective view showing a front surface of a display device according to one or more embodiments. FIG. 2 is a perspective view showing a rear surface of a display device according to one or more embodiments.

A first direction DR1, a second direction DR2, and a third direction DR3 are defined as shown in FIG. 1. The first direction DR1 and the second direction DR2 may be perpendicular to each other, the first direction DR1 and the third direction DR3 may be perpendicular to each other, and the second direction DR2 and the third direction DR3 may be perpendicular to each other. It may be understood that the first direction DR1 refers to a vertical direction of the display device, the second direction DR2 refers to a horizontal direction of the display device, and the third direction DR3 refers to a height direction (i.e., a thickness direction) of the display device.

In the following disclosure, unless otherwise stated, "direction" may refer to both of directions extending along the direction. Further, when it is necessary to distinguish both "directions" extending in both sides, one side will be referred to as "one side in the direction" and the other side will be referred to as "the other side in the direction." Referring to FIG. 1, a direction in which an arrow is directed is referred to as one side, and the opposite direction is referred to as the other side.

In addition, for simplicity of description, in referring to a display device 10 or the surfaces of each member constituting the display device 10, one surface facing one side in the direction in which an image is displayed (e.g., in the third direction DR3) is referred to as a top surface, and the other surface opposite to the one surface is referred to as a bottom surface. However, the present disclosure is not limited thereto, and the one surface and the other surface of the member may be referred to as a front surface and a rear surface, respectively, or may also be referred to as a first surface or a second surface. Further, in describing the relative position of each member of the display device 10, one side in the third direction DR3 may be referred to as an upper side and the other side in the third direction DR3 may be referred to as a lower side.

Referring to FIGS. 1 and 2, a display device 10 according to one or more embodiments may be applied to portable electronic devices such as a mobile phone, a smartphone, a tablet personal computer, a mobile communication terminal, an electronic organizer, an electronic book, a portable multimedia player (PMP), a navigation system, an ultra-mobile PC (UMPC), and/or the like. Alternatively, the display device 10 according to one or more embodiments may be applied as a display of a television, a laptop, a monitor, a billboard, or an Internet-of-Things (IoT) terminal.

The display device 10 may have a planar shape similar to a quadrilateral shape. For example, the display device 10 may have a planar shape similar to a rectangular shape having short sides in the first direction DR1 and long sides in the second direction DR2, as shown in FIG. 1. A corner where the short side in the first direction DR1 and the long side in the second direction DR2 meet may be right-angled or rounded with a suitable curvature (e.g., a predetermined curvature). The planar shape of the display device 10 is not limited to a quadrilateral shape, and may be formed in a shape similar to another polygonal shape, a circular shape, and/or elliptical shape.

The display device 10 may include a display area DA in which an image is displayed in the third direction DR3, and a non-display area NDA in which no image is displayed, as an area other than the display area DA. For example, the non-display area NDA may be located on each side surface of the display device 10, but is not limited thereto. In one or more embodiments, the non-display area NDA may be located to be around (e.g., to surround) the edge of the display area DA, but the present disclosure is not limited thereto. In one or more embodiments, the display area DA and the non-display area NDA of the display device 10 may also be applied to a substrate 100 to be described later.

The display device 10 according to one or more embodiments may include the substrate 100, a plurality of pixels PX, a plurality of side surface lines 200, and a driver DRP, and the driver DRP may include a circuit board CB and a display driving circuit DC.

The substrate 100 may serve as a base of the display device 10. In one or more embodiments, the substrate 100 may contain glass as a rigid substrate having rigidity, but the present disclosure is not limited thereto. For example, the substrate 100 may contain polyimide as a flexible substrate having flexibility. Hereinafter, for simplicity of description, a case where the substrate 100 contains glass as a rigid substrate will be mainly described.

The substrate 100 may have a three-dimensional shape similar to a rectangular parallelepiped, in which corners formed by a top surface and side surfaces of the rectangular parallelepiped and corners formed by a bottom surface and the side surfaces thereof are bent. In other words, the substrate 100 may have a three-dimensional shape similar to a rectangular parallelepiped, in which the edges of the top and bottom surfaces are bent. FIGS. 1 and 2 illustrate that chamfered surfaces are formed between the top surface and the side surface of the substrate 100 and between the bottom surface and the side surface thereof. In one or more embodiments, the surfaces of the substrate 100 where the corners are bent (e.g., chamfered surfaces) may be formed between the top surface and the side surface or between the bottom surface and the side surface of the substrate 100, but the present disclosure is not limited thereto.

The substrate 100 may include a first surface 100*a*, a second surface 100*b*, a plurality of chamfered surfaces, and a plurality of side surfaces.

The first surface 100*a* may be the top surface of the substrate 100. The first surface 100*a* may have a rectangular shape with short sides in the first direction DR1 and long sides in the second direction DR2.

The second surface 100*b* may be a surface opposite to the first surface 100*a*. The second surface 100*b* may be the bottom surface of the substrate 100. The second surface 100*b* may have a rectangular shape with short sides in the first direction DR1 and long sides in the second direction DR2.

The plurality of side surfaces, which are located between the first surface 100*a* and the second surface 100*b*, may be side surfaces of the substrate 100. The plurality of side surfaces may include a first side surface 100*c*. The first side surface 100*c* may be a surface located between the first surface 100*a* and the second surface 100*b* located in the first direction DR1.

The plurality of chamfered surfaces may refer to obliquely cut surfaces that are located between the first surface 100*a* and the plurality of side surfaces and between the second surface 100*b* and the plurality of side surfaces to prevent or reduce occurrence of chipping defects in the plurality of side surface lines 200 to be described later. Due to the plurality of chamfered surfaces, the bending angles of the plurality of side surface lines 200 may become gentle, which makes it possible to prevent or reduce occurrence of chipping or cracking in the plurality of side surface lines 200.

For simplicity of description, from among the plurality of chamfered surfaces, the chamfered surface located between the first surface 100*a* and the first side surface 100*c* will be referred to as a first chamfered surface 100*d*1, and the chamfered surface located between the second surface 100*b* and the first side surface 100*c* will be referred to as a second chamfered surface 100*d*2.

For example, the first chamfered surface 100*d*1 may extend from one side of the first surface 100*a* in the first direction DR1, and the second chamfered surface 100*d*2 may extend from one side of the second surface 100*b* in the first direction DR1. The first chamfered surface 100*d*1 may connect the first surface 100*a* to the first side surface 100*c*, and the second chamfered surface 100*d*2 may connect the second surface 100*b* to the first side surface 100*c*.

The plurality of pixels PX may be located on the first surface 100*a* of the substrate 100 to display an image. The plurality of pixels PX may be arranged in a matrix form in the first direction DR1 and the second direction DR2. For example, the plurality of pixels PX may be arranged along rows and columns of a matrix in the first direction DR1 and the second direction DR2. The structure of the plurality of pixels PX will be described in detail later.

Each of the plurality of side surface lines 200 may connect a first pad PAD1 (see FIG. 7) located on the first surface 100*a* and a second pad PAD2 (see FIG. 8) located on the second surface 100*b*. The first pads PAD1 may be connected to data lines connected to the plurality of pixels PX located on the first surface 100*a* of the substrate 100. The plurality of side surface lines 200 may be arranged to be spaced from each other in the second direction DR2.

The plurality of side surface lines 200 may be located on the first surface 100*a*, the second surface 100*b*, at least any two chamfered surfaces from among the plurality of chamfered surfaces, and at least any one side surface from among the plurality of side surfaces. For example, as shown in FIGS. 1 and 2, the plurality of side surface lines 200 may be located on the first surface 100*a*, the second surface 100*b*, the first chamfered surface 100*d*1, the second chamfered surface 100*d*2, and the first side surface 100*c* to connect the first pads PAD1 located on one side of the first surface 100*a* of the substrate 100 in the first direction DR1 and the second pads PAD2 located on one side of the second surface 100*b* thereof in the first direction DR1. The shape of each of the plurality of side surface lines 200 will be described in detail later.

In one or more embodiments, the plurality of side surface lines 200 may be located only on one side of the substrate 100 in the first direction DR1, but the present disclosure is not limited thereto. For example, the plurality of side surface lines 200 may also be located on the other side of the substrate 100 in the first direction DR1, on one side thereof in the second direction DR2, or on the other side thereof in the second direction DR2.

In this case, the first pads PAD1 located on the first surface 100*a* of the substrate 100 may be additionally located on the other side in the first direction DR1, one side in the second direction DR2, or the other side in the second direction DR2, and the second pads PAD2 located on the second surface 100*b* of the substrate 100 may be additionally located on the other side in the first direction DR1, one side in the second direction DR2, or the other side in the second direction DR2.

FIGS. 1 and 2 illustrate that the plurality of the side surface lines 200 are located on one side of the substrate 100 in the first direction DR1. Hereinafter, for simplicity of description, a case where the plurality of side surface lines 200 are located only on one side of the substrate 100 in the first direction DR1 will be mainly described.

The circuit boards CB may be located on the second surface 100*b* of the substrate 100. Each of the circuit boards CB may be connected to third pads PAD3 (refer to FIG. 8) located on the second surface 100*b* of the substrate 100 using a conductive adhesive member such as an anisotropic conductive film. As will be described later, the third pads PAD3 are electrically connected to the second pads PAD2, respectively, so that the circuit board CB may be electrically connected to the first pads PAD1 through the side surface lines 200. The circuit boards CB may each be a flexible printed circuit board, a printed circuit board, or a flexible film such as a chip on film.

The display driving circuit DC may generate data voltages and provide them to the data lines extending from the pixels PX through the circuit board CB, the third pads PAD3, the second pads PAD2, the plurality of side surface lines 200, and the first pads PAD1. The display driving circuit DC may be formed as an integrated circuit (IC) and attached onto the circuit board CB. Alternatively, the display driving circuit DC may be directly attached to the second surface 100*b* of the substrate 100 by a chip on glass (COG) method.

By connecting the first pads PAD1 located on the first surface 100*a* and the second pads PAD2 located on the second surface 100*b* using the plurality of side surface lines 200 as described above, the flexible film bent along the side surface of the substrate 100 may be omitted and, thus, a bezel-less display device 10 with a reduced or minimized non-display area NDA may be realized.

Hereinafter, the structure of the pixel PX of the display device 10 according to one or more embodiments will be described.

Figure 3:
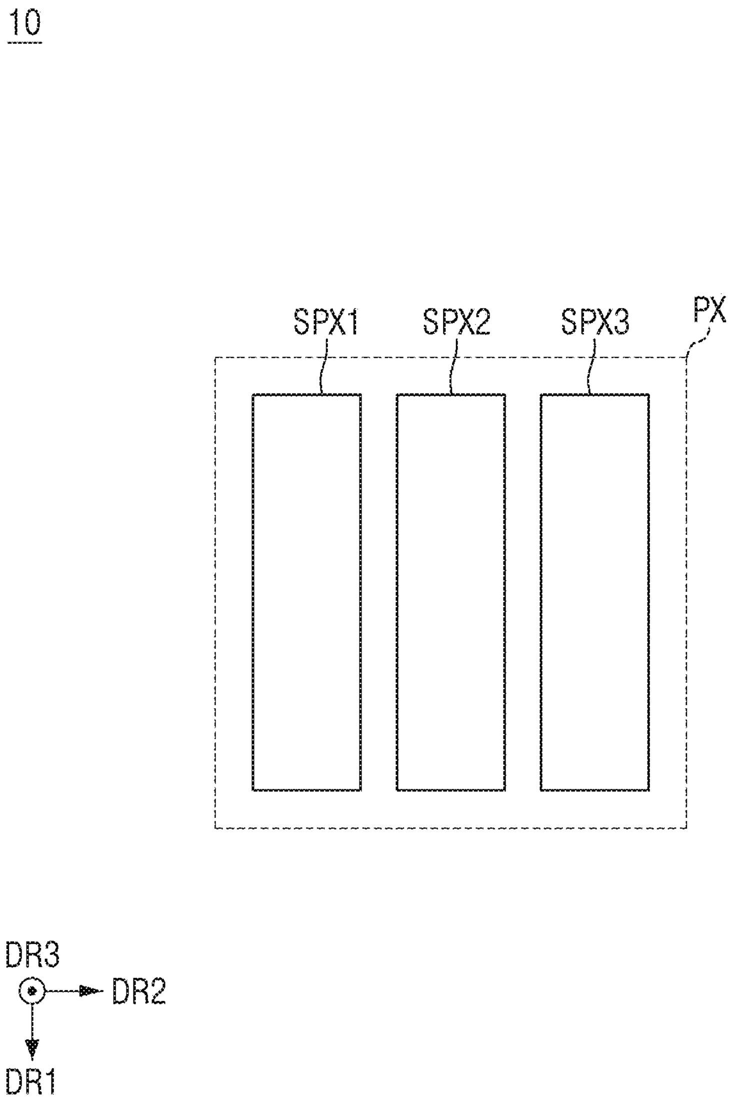
FIG. 3 is a diagram schematically illustrating a structure of a pixel of a display device according to one or more embodiments.
Figure 4:
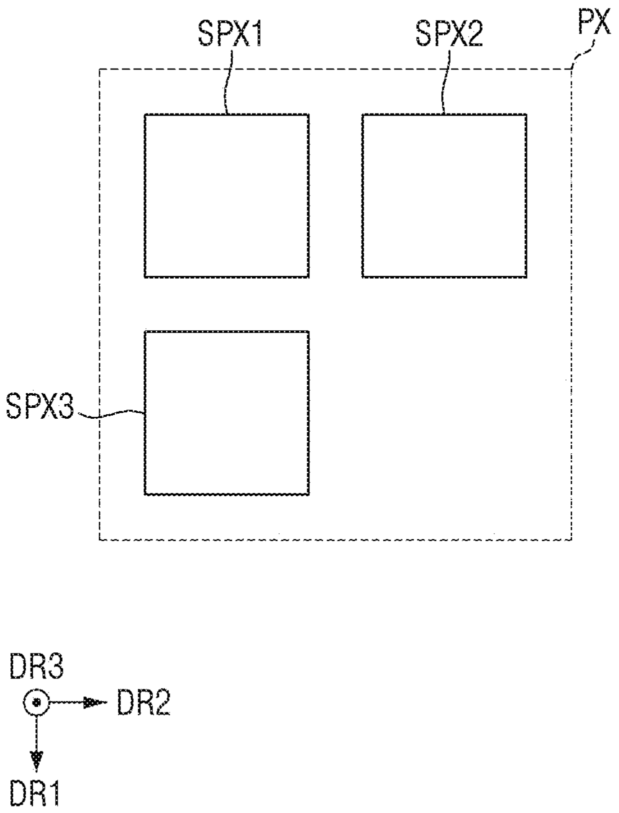
FIG. 4 is a diagram schematically illustrating a structure of a pixel of a display device according to one or more embodiments.
Figure 5:
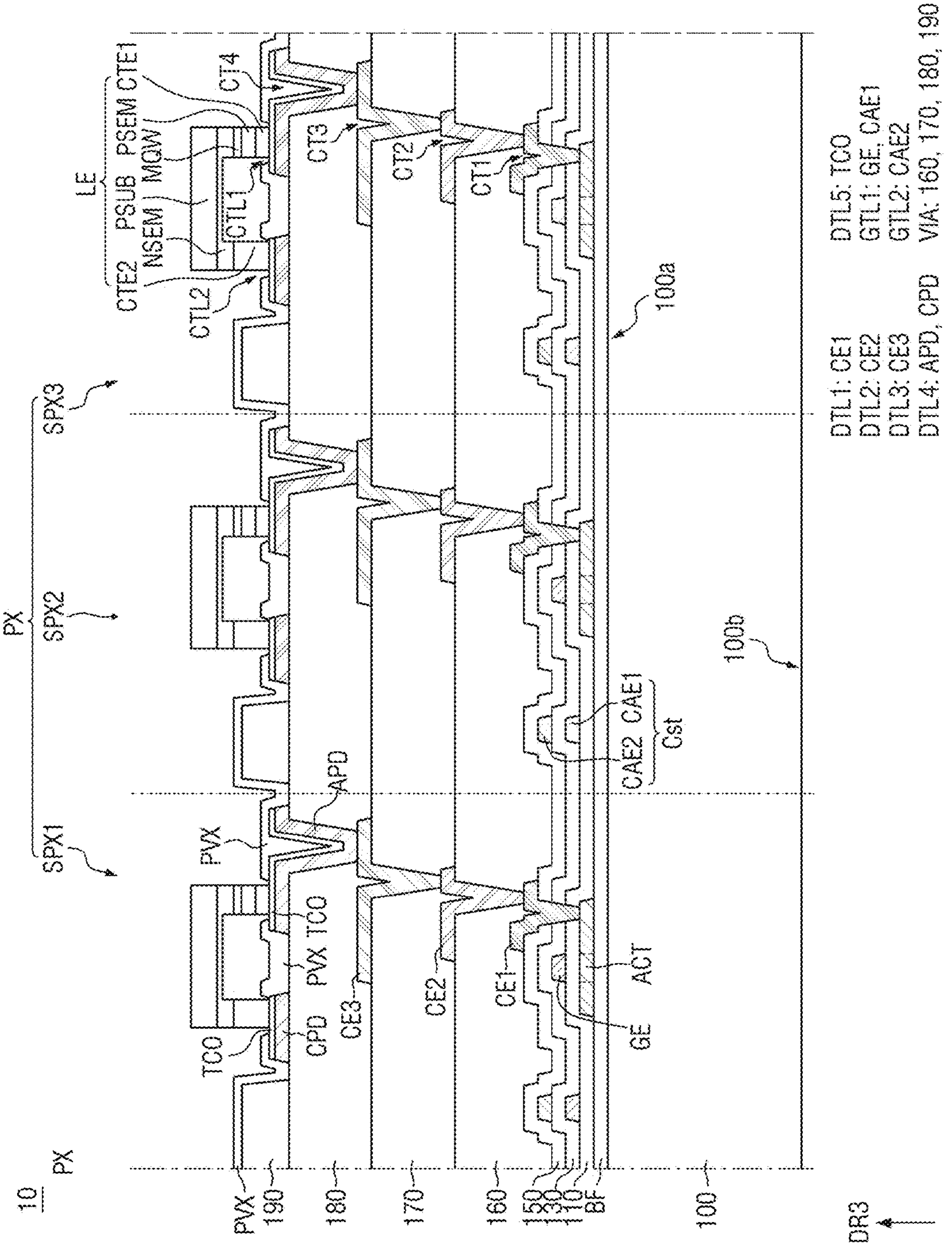
FIG. 5 is a diagram schematically illustrating a cross-sectional structure of a pixel according to one or more embodiments.

FIG. 3 is a diagram schematically illustrating a structure of a pixel of a display device according to one or more embodiments. FIG. 4 is a diagram schematically illustrating a structure of a pixel of a display device according to one or more embodiments. FIG. 5 is a diagram schematically illustrating a cross-sectional structure of a pixel according to one or more embodiments.

Referring to FIGS. 3 and 4, each of the pixels PX may include a plurality of sub-pixels. Although FIGS. 3 and 4 illustrate that each of the pixels PX includes three sub-pixels SPX1, SPX2, and SPX3 (a first sub-pixel SPX1, a second sub-pixel SPX2, and a third sub-pixel SPX3), the number of sub-pixels is not limited thereto. Each of the first sub-pixel SPX1, the second sub-pixel SPX2, and the third sub-pixel SPX3 may be connected to any one of the data lines and at least one of scan lines.

Each of the first sub-pixel SPX1, the second sub-pixel SPX2, and the third sub-pixel SPX3 may have a rectangular, square, or rhombic planar shape. For example, each of the first sub-pixel SPX1, the second sub-pixel SPX2, and the third sub-pixel SPX3 may have a rectangular planar shape with long sides in the first direction DR1 and short sides in the second direction DR2 as shown in FIG. 3. Alternatively, each of the first sub-pixel SPX1, the second sub-pixel SPX2, and the third sub-pixel SPX3 may have a square or rhombic planar shape having sides of the same length in the first direction DR1 and the second direction DR2 as shown in FIG. 4.

The first sub-pixel SPX1, the second sub-pixel SPX2, and the third sub-pixel SPX3 may be arranged along the second direction DR2. Alternatively, any one of the second sub-pixel SPX2 and/or the third sub-pixel SPX3 and the first sub-pixel SPX1 may be arranged along the second direction DR2, and the other one of the second sub-pixel SPX2 and/or the third sub-pixel SPX3 and the first sub-pixel SPX1 may be arranged along the first direction DR1. For example, as shown in FIG. 4, the first sub-pixel SPX1 and the second sub-pixel SPX2 may be arranged along the first direction DR1, and the first sub-pixel SPX1 and the third sub-pixel SPX3 may be arranged along the second direction DR2.

The first sub-pixel SPX1 may emit a first light, the second sub-pixel SPX2 may emit a second light, and the third sub-pixel SPX3 may emit a third light. In this case, the first light may be light of a red wavelength band, the second light may be light of a green wavelength band, and the third light may be light of a blue wavelength band. Although the red wavelength band may be a wavelength band of about 600 nm to about 750 nm, the green wavelength band may be a wavelength band of about 480 nm to about 560 nm, and the blue wavelength band may be a wavelength band of about 370 nm to about 460 nm, but embodiments of the present disclosure are not limited thereto.

Each of the first sub-pixel SPX1, the second sub-pixel SPX2, and the third sub-pixel SPX3 may include an inorganic light-emitting element having an inorganic semiconductor as a light-emitting element LE (see FIG. 5) that emits light. For example, the inorganic light-emitting element may be a flip chip type micro light-emitting diode (LED), but is not limited thereto.

As shown in FIGS. 3 and 4, the area of the first sub-pixel SPX1, the area of the second sub-pixel SPX2, and the area of the third sub-pixel SPX3 may be substantially the same, but the present disclosure is not limited thereto. For example, the area of the first sub-pixel SPX1, the area of the second sub-pixel SPX2, and the area of the third sub-pixel SPX3 may be different from each other.

Referring to FIG. 5, each of the plurality of sub-pixels SPX1, SPX2, and SPX3 constituting the pixel PX may include a plurality of conductive layers, a plurality of insulating layers, and a plurality of light-emitting elements LE. The plurality of conductive layers and the plurality of insulating layers may form a transistor layer that transmits an electrical signal to the light-emitting element LE.

The plurality of sub-pixels located on the substrate 100 may include, as the plurality of conductive layers, an active layer ACT, a first gate metal layer GTL1, a second gate metal layer GTL2, a first data metal layer DTL1, a second data metal layer DTL2, a third data metal layer DTL3, a fourth data metal layer DTL4, and a fifth data metal layer DTL5. Further, the plurality of pixels PX may include, as the plurality of insulating layers, a buffer layer BF, a gate-insulating layer 110, a first interlayer insulating layer 130, a second interlayer insulating layer 150, and an upper via layer VIA, and the upper via layer VIA may include a first via layer 160, a second via layer 170, a third via layer 180, and a fourth via layer 190.

The substrate 100 serves as a base of the display device 10, and may be a base substrate or a base member for supporting the plurality of pixels PX. As described above, the substrate 100 may be a rigid substrate made of a glass material.

The buffer layer BF may be located on the top surface of the substrate 100, i.e., on the first surface 100*a*. The buffer layer BF may serve to prevent or reduce permeation of air or moisture into element layers constituting the pixel PX. The buffer layer BF may be formed of a plurality of inorganic layers that are alternately stacked. For example, the buffer layer BF may be formed of multiple layers in which one or more inorganic layers of a silicon nitride layer, a silicon oxynitride layer, a silicon oxide layer, a titanium oxide layer, and/or an aluminum oxide layer are alternately stacked. In one or more embodiments, the buffer layer BF may be omitted.

The active layer ACT may be located on the buffer layer BF. The active layer ACT may include a silicon semiconductor such as polycrystalline silicon, monocrystalline silicon, low-temperature polycrystalline silicon, and/or amorphous silicon, or may include an oxide semiconductor.

The active layer ACT may include a channel region, a first region located on one side of the channel region, and a second region located on the other side of the channel region. The channel region of the active layer ACT may be a region overlapping a gate electrode GE to be described later in the third direction DR3 (e.g., a thickness direction of the substrate 100). Each of the first region and the second region of the active layer ACT may be a region that does not overlap the gate electrode GE. The first region and the second region may be conductive regions obtained by doping a silicon semiconductor or an oxide semiconductor with ions.

The gate-insulating layer 110 may be located on the active layer ACT and the buffer layer BF. The gate-insulating layer 110 may be formed of an inorganic layer, for example, a silicon nitride layer, a silicon oxynitride layer, a silicon oxide layer, a titanium oxide layer, and/or an aluminum oxide layer.

The first gate metal layer GTL1 may be located on the gate-insulating layer 110. The first gate metal layer GTL1 may include a gate electrode GE and a first capacitor electrode CAE1 of each sub-pixel. The gate electrode GE may form a thin film transistor for driving the pixel PX together with the active layer ACT. The first gate metal layer GTL1 may be formed as a single layer or multiple layers made of one or more of molybdenum (Mo), aluminum (Al), chromium (Cr), gold (Au), titanium (Ti), nickel (Ni), neodymium (Nd), and/or copper (Cu), and/or an alloy thereof.

The first interlayer insulating layer 130 may be located on the first gate metal layer GTL1 and the gate-insulating layer 110. The first interlayer insulating layer 130 may be formed of an inorganic layer, for example, a silicon nitride layer, a silicon oxynitride layer, a silicon oxide layer, a titanium oxide layer, and/or an aluminum oxide layer.

The second gate metal layer GTL2 may be located on the first interlayer insulating layer 130. The second gate metal layer GTL2 may include a second capacitor electrode CAE2. The second capacitor electrode CAE2 may overlap the first capacitor electrode CAE1 in the third direction DR3 to form a capacitor Cst. The second gate metal layer GTL2 may be formed as a single layer or multiple layers made of one or more of molybdenum (Mo), aluminum (Al), chromium (Cr), gold (Au), titanium (Ti), nickel (Ni), neodymium (Nd), and/or copper (Cu), and/or an alloy thereof.

The second interlayer insulating layer 150 may be located on the second gate metal layer GTL2 and the first interlayer insulating layer 130. The second interlayer insulating layer 150 may be formed of an inorganic layer, for example, a silicon nitride layer, a silicon oxynitride layer, a silicon oxide layer, a titanium oxide layer, and/or an aluminum oxide layer.

The first data metal layer DTL1 including a first connection electrode CE1 and a data line may be located on the second interlayer insulating layer 150. The first data metal layer DTL1 may be formed as a single layer or multiple layers made of one or more of molybdenum (Mo), aluminum (Al), chromium (Cr), gold (Au), titanium (Ti), nickel (Ni), neodymium (Nd), and/or copper (Cu), and/or an alloy thereof. In one or more embodiments, the first data metal layer DTL1 may have a two-layer structure of Ti/Al or a three-layer structure of Ti/Al/Ti.

The first connection electrode CE1 may be connected to the first region or the second region of the active layer ACT through a first contact hole CT1 penetrating the gate-insulating layer 110, the first interlayer insulating layer 130 and the second interlayer insulating layer 150.

The first via layer 160 for flattening the stepped portion formed by the active layer ACT, the first gate metal layer GTL1, the second gate metal layer GTL2, and the first data metal layer DTL1 may be located on the first data metal layer DTL1 and the second interlayer insulating layer 150. The first via layer 160 may be formed of an organic layer such as acryl resin, epoxy resin, phenolic resin, polyamide resin, polyimide resin and/or the like.

The second data metal layer DTL2 may be located on the first via layer 160. The second data metal layer DTL2 may include a second connection electrode CE2. The second connection electrode CE2 may be connected to the first connection electrode CE1 through a second contact hole CT2 penetrating the first via layer 160. The second data metal layer DTL2 may be formed as a single layer or multiple layers made of one or more of molybdenum (Mo), aluminum (Al), chromium (Cr), gold (Au), titanium (Ti), nickel (Ni), neodymium (Nd), and/or copper (Cu), and/or an alloy thereof. In one or more embodiments, the second data metal layer DTL2 may have a two-layer structure of Ti/Al or a three-layer structure of Ti/Al/Ti.

The second via layer 170 may be located on the second data metal layer DTL2 and the first via layer 160. The second via layer 170 may be formed of an organic layer such as acryl resin, epoxy resin, phenolic resin, polyamide resin, polyimide resin, and/or the like.

The third data metal layer DTL3 may be located on the second via layer 170. The third data metal layer DTL3 may include a third connection electrode CE3. The third connection electrode CE3 may be connected to the second connection electrode CE2 through a third contact hole CT3 penetrating the second via layer 170. The third data metal layer DTL3 may be formed as a single layer or multiple layers made of one or more of molybdenum (Mo), aluminum (Al), chromium (Cr), gold (Au), titanium (Ti), nickel (Ni), neodymium (Nd), and/or copper (Cu) or an alloy thereof. In one or more embodiments, the third data metal layer DTL3 may have a two-layer structure of Ti/Al or a three-layer structure of Ti/Al/Ti.

The third via layer 180 may be located on the third data metal layer DTL3 and second via layer 170. The third via layer 180 may be formed of an organic layer such as acryl resin, epoxy resin, phenolic resin, polyamide resin, polyimide resin and/or the like.

The fourth data metal layer DTL4 may be located on the third via layer 180. The fourth data metal layer DTL4 may include an anode pad electrode APD and a cathode pad electrode CPD. The anode pad electrode APD may be connected to the third connection electrode CE3 through a fourth contact hole CT4 penetrating the third via layer 180. The cathode pad electrode CPD may receive a first power voltage that is a low potential voltage. The fourth data metal layer DTL4 may be formed as a single layer or multiple layers made of one or more of molybdenum (Mo), aluminum (Al), chromium (Cr), gold (Au), titanium (Ti), nickel (Ni), neodymium (Nd), and/or copper (Cu), and/or an alloy thereof. In one or more embodiments, the fourth data metal layer DTL4 may have a two-layer structure of Ti/Al or a three-layer structure of Ti/Al/Ti. Hereinafter, for simplicity of description, a case where the fourth data metal layer DTL4 has a three-layer structure of Ti/Al/Ti will be mainly described.

The fifth data metal layer DTL5 may be located on each of the anode pad electrode APD and the cathode pad electrode CPD. The fifth data metal layer DTL5 may include a transparent conductive layer (TCO) for increasing an adhesive strength with the first contact electrode CTE1 and the second contact electrode CTE2 of the light-emitting element LE. The fifth data metal layer DTL5 may be made of a transparent conductive oxide such as indium tin oxide (ITO) and/or indium zinc oxide (IZO).

The fourth via layer 190 may be further located on the third via layer 180. The fourth via layer 190 may be located in a space between the plurality of sub-pixels. In other words, the fourth via layer 190 may be located on a portion of the third via layer 180 without being located on the entire third via layer 180. That is, the fourth via layer 190 may serve as a pixel defining layer for partitioning the sub-pixels. The fourth via layer 190 may be formed of an organic layer such as acryl resin, epoxy resin, phenolic resin, polyamide resin, polyimide resin and the like.

An upper passivation layer PVX may be located on the third via layer 180, the fifth data metal layer DTL5, and the fourth via layer 190. The upper passivation layer PVX may cover the edges of a transparent conductive layer TCO located on the anode pad electrode APD and a transparent conductive layer TCO located on the cathode pad electrode CPD, and may cover the top and side surfaces of the fourth via layer 190, and the top surface of the third via layer 180 exposed by the fourth via layer 190. The upper passivation layer PVX may be formed of an inorganic layer, e.g., a silicon nitride layer, a silicon oxynitride layer, a silicon oxide layer, a titanium oxide layer, and/or an aluminum oxide layer.

A first element contact hole CTL1 and a second element contact hole CTL2 exposing a portion of the transparent conductive layer TCO located on the anode pad electrode APD and a portion of the transparent conductive layer TCO located on the cathode pad electrode CPD may be formed in the upper passivation layer PVX. The first element contact hole CTL1 may expose a portion of the transparent conductive layer TCO located on the anode pad electrode APD, and the second element contact hole CTL2 may expose a portion of the transparent conductive layer TCO located on the cathode pad electrode CPD.

Each of the plurality of sub-pixels SPX1, SPX2, and SPX3 may include one light-emitting element LE. The light-emitting elements LE may be located on the transparent conductive layer TCO located on the anode pad electrode APD and the transparent conductive layer TCO located on the cathode pad electrode CPD that are respectively exposed by the first element contact hole CTL1 and the second element contact hole CTL2 formed in the upper passivation layer PVX. FIG. 5 illustrates that the light-emitting element LE is a flip chip type micro LED in which the first contact electrode CTE1 and the second contact electrode CTE2 are located to face the anode pad electrode APD and the cathode pad electrode CPD, respectively.

The light-emitting element LE may be an inorganic light-emitting element made of an inorganic material such as GaN. The light-emitting element LE may have a length of several to several hundreds of μm in each of the first direction DR1, the second direction DR2, and the third direction DR3. For example, the light-emitting element LE may have a length of about 100 μm or less in each of the first direction DR1, the second direction DR2, and the third direction DR3.

The light-emitting elements LE may be formed by growing on a semiconductor substrate such as a silicon wafer. Each of the light-emitting elements LE may be directly transferred from a silicon wafer onto the anode pad electrode APD and the cathode pad electrode CPD of the substrate 100. Alternatively, each of the light-emitting elements LE may be transferred onto the anode pad electrode APD and the cathode pad electrode CPD of the substrate 100 through an electrostatic method using an electrostatic head or a stamping method using an elastic polymer material such as PDMS or silicon as a transfer substrate.

Each of the light-emitting elements LE may be a light-emitting structure including a base substrate PSUB, an n-type semiconductor NSEM, an active layer MQW, a p-type semiconductor PSEM, the first contact electrode CTE1, and the second contact electrode CTE2.

The base substrate PSUB of the light-emitting element LE may be a sapphire substrate, but the present disclosure is not limited thereto.

The n-type semiconductor NSEM of the light-emitting element LE may be located on one surface of the base substrate PSUB. For example, the n-type semiconductor NSEM may be located on the bottom surface of the base substrate PSUB. The n-type semiconductor NSEM may be formed of GaN doped with an n-type conductive dopant such as Si, Ge, and/or Sn.

The active layer MQW of the light-emitting element LE may be located on a portion of one surface of the n-type semiconductor NSEM. The active layer MQW may include a material having a single or multiple quantum well structure. When the active layer MQW contains a material having a multiple quantum well structure, the active layer MQW may have the structure in which a plurality of well layers and barrier layers are alternately laminated. In this case, the well layer may be formed of InGaN, and the barrier layer may be formed of GaN and/or AlGaN, but the present disclosure is not limited thereto.

Alternatively, the active layer MQW may have a structure in which semiconductor materials having large band gap energy and semiconductor materials having small band gap energy are alternately stacked, and may include Group III to Group V semiconductor materials according to the wavelength band of the emitted light.

The p-type semiconductor PSEM may be located on one surface of the active layer MQW. The p-type semiconductor PSEM may be formed of GaN doped with a p-type conductive dopant such as Mg, Zn, Ca, Se, and/or Ba.

The first contact electrode CTE1 may be located on one surface of the p-type semiconductor PSEM, and the second contact electrode CTE2 may be located on another portion of one surface of the n-type semiconductor NSEM. The other portion of one surface of the n-type semiconductor NSEM on which the second contact electrode CTE2 is located may be placed apart from the portion of one surface of the n-type semiconductor NSEM on which the active layer MQW is located.

The first contact electrode CTE1 and the anode pad electrode APD may be bonded to each other by a conductive adhesive member such as an anisotropic conductive film (ACF) or an anisotropic conductive paste (ACP). Alternatively, the first contact electrode CTE1 and the anode pad electrode APD may be bonded to each other by a soldering process. The second contact electrode CTE2 and the cathode pad electrode CPD may be bonded to each other by a conductive adhesive member such as an anisotropic conductive film (ACF) or an anisotropic conductive paste (ACP). Alternatively, the second contact electrode CTE2 and the cathode pad electrode CPD may be bonded to each other by a soldering process.

In one or more embodiments, the first contact electrode CTE1 and the second contact electrode CTE2 may be connected to the anode pad electrode APD or the anode pad electrode APD vis TCO.

Figure 6:
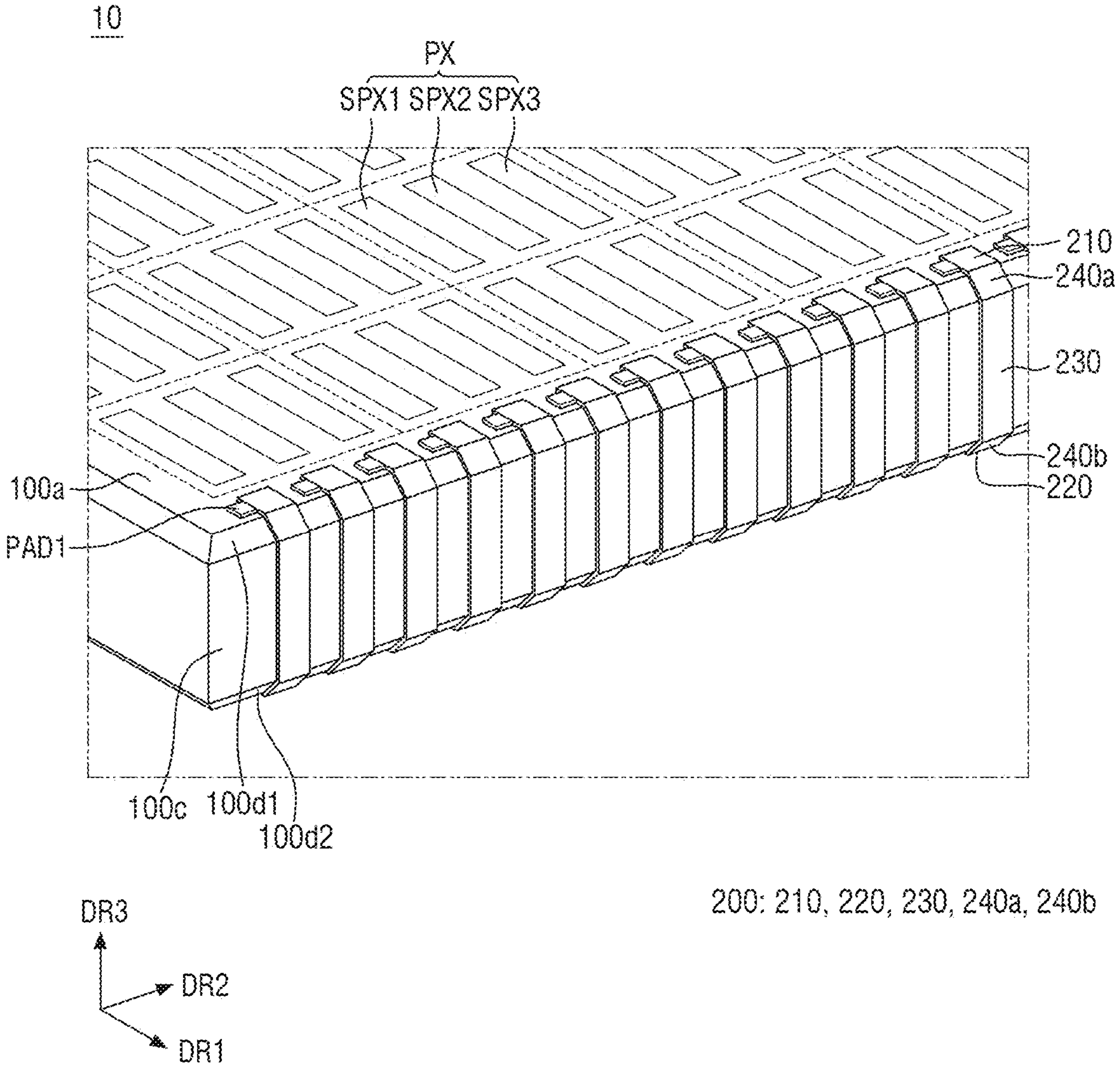
FIG. 6 is a perspective view illustrating the arrangement between pixels and side surface lines of a display device according to one or more embodiments.
Figure 7:
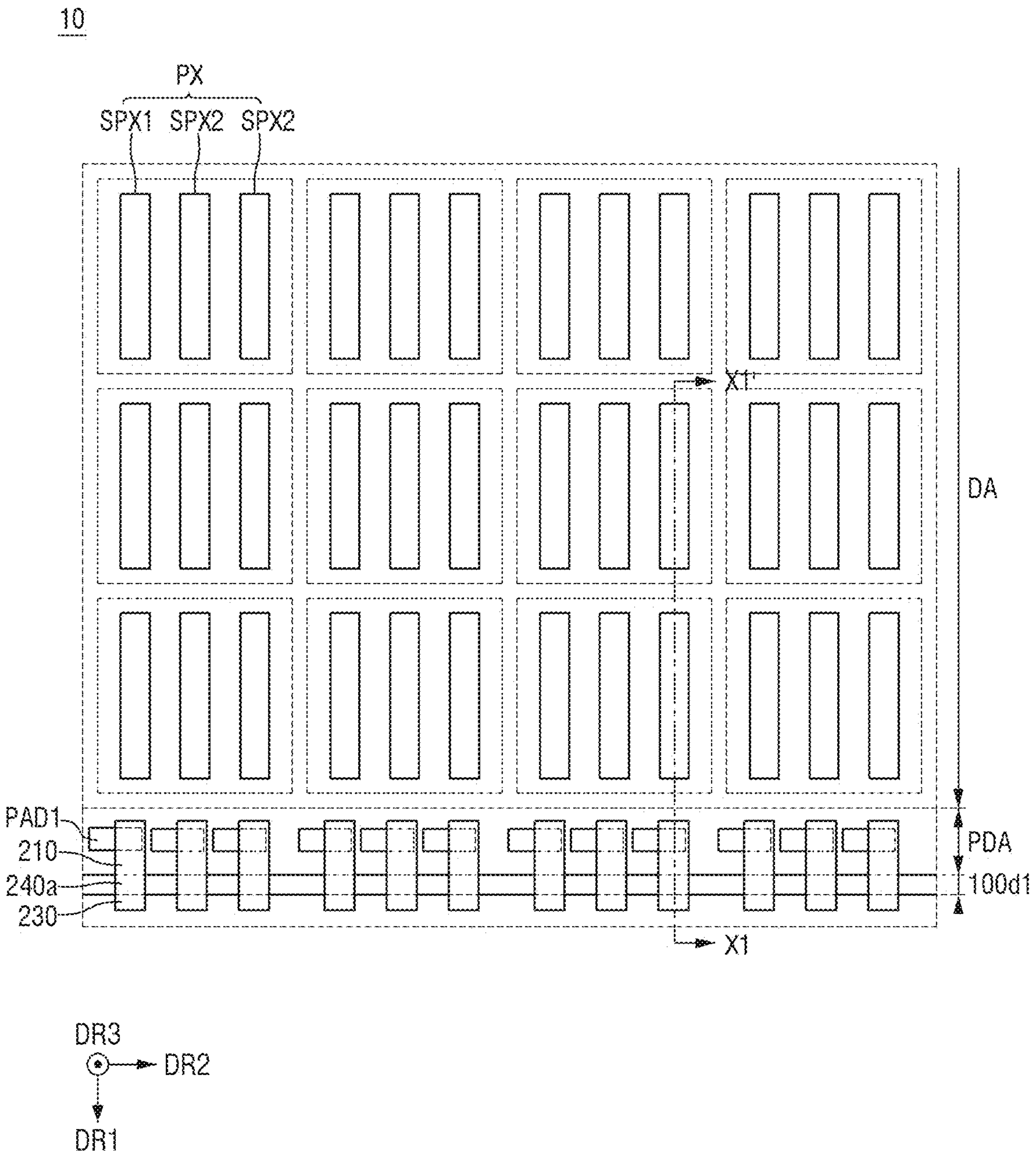
FIG. 7 is a plan view illustrating the arrangement between pixels and side surface lines of a display device according to one or more embodiments.
Figure 8:
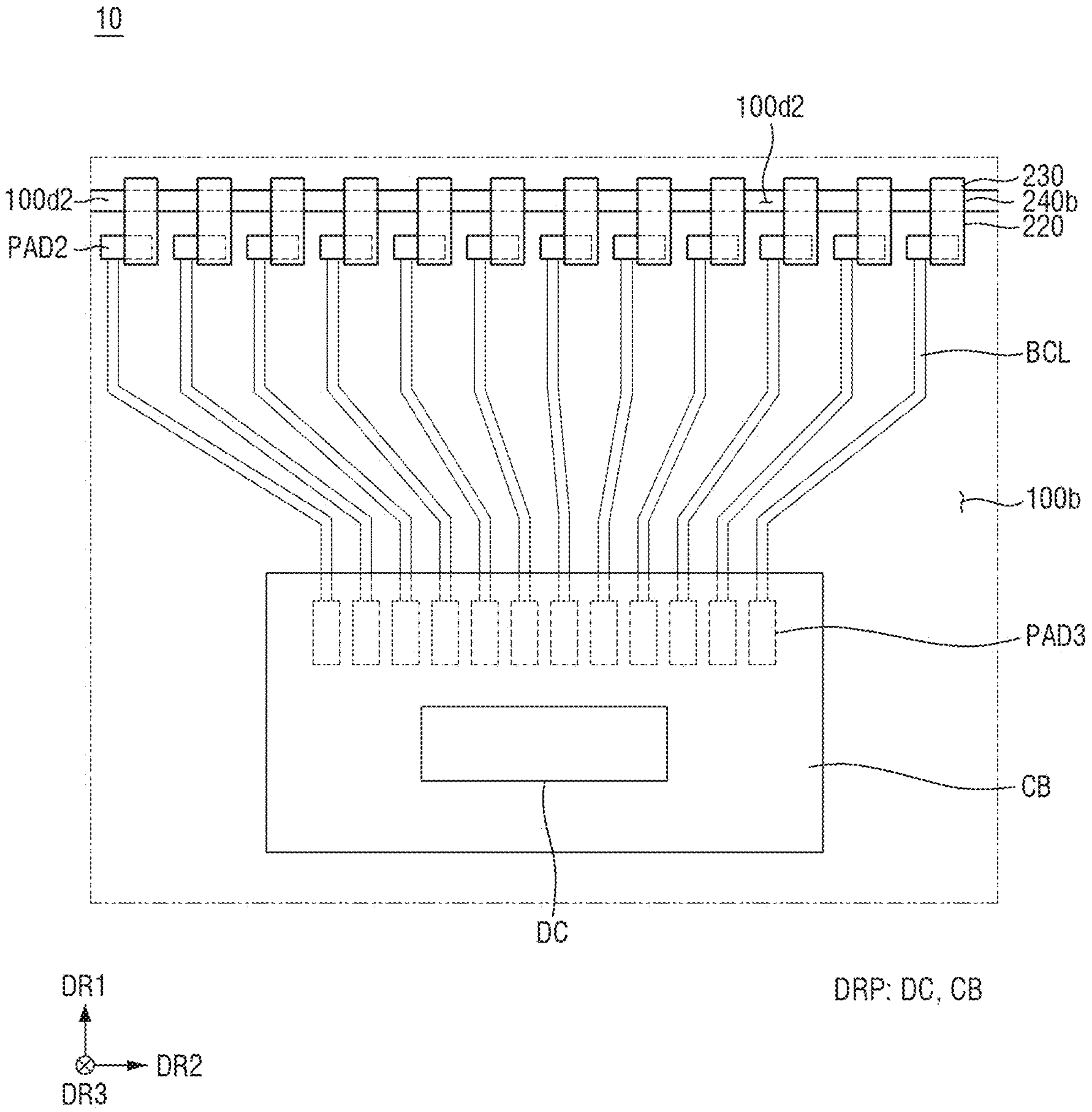
FIG. 8 is a rear view illustrating the arrangement between a driver and side surface lines of a display device according to one or more embodiments.

FIG. 6 is a perspective view illustrating the arrangement between pixels and side surface lines of a display device according to one or more embodiments. FIG. 7 is a plan view illustrating the arrangement between pixels and side surface lines of a display device according to one or more embodiments. FIG. 8 is a rear view illustrating the arrangement between a driver and side surface lines of a display device according to one or more embodiments.

Referring to FIGS. 6 to 8, the display device 10 may further include the plurality of first pads PAD1, the plurality of second pads PAD2, the plurality of third pads PAD3, and a plurality of bottom surface connection lines BCL, and may include the side surface line 200.

Referring to FIG. 7 in conjunction with FIG. 6, the plurality of first pads PAD1 may serve to transmit the electrical signal of the driver to each of the plurality of pixels PX. The first pads PAD1 may be located on the first surface 100*a* of the substrate 100. The first pads PAD1 may be located at one edge of the first surface 100*a* of the substrate 100 in the first direction DR1, i.e., in the pad area PDA. The pad area PDA, which is a portion of the non-display area NDA, may refer to the non-display area NDA located at one edge of the display area DA in the first direction DR1. The first pads PAD1 may be arranged along the second direction DR2.

Each of the plurality of first pads PAD1 may have a shape extending in the second direction DR2. The side surface line 200 may expose a portion of each of the plurality of first pads PAD1. In other words, the width of the side surface line 200 in the second direction DR2 may be smaller than the width of each of the plurality of first pads PAD1 in the second direction DR2. In one or more embodiments, a portion of the first pad PAD1 may be exposed while protruding from the side surface line 200 toward the other side in the second direction DR2, but the present disclosure is not limited thereto. For example, a portion of the first pad PAD1 may be exposed while protruding from the side surface line 200 toward one side in the second direction DR2.

A portion of the first pad PAD1, which protrudes from the side surface line 200 toward the other side in the second direction DR2, may not overlap the side surface line 200 in the third direction DR3, and serve as a part capable of inspecting the contactability of a plurality of pad electrodes constituting the first pad PAD1.

A portion of the first pad PAD1 overlapping the side surface line 200 may be a region where the plurality of pad electrodes constituting the first pad PAD1 are in contact with the side surface line 200. For example, the portion of the first pad PAD1 overlapping the side surface line 200 may be referred to as a contact portion.

Figure 9:
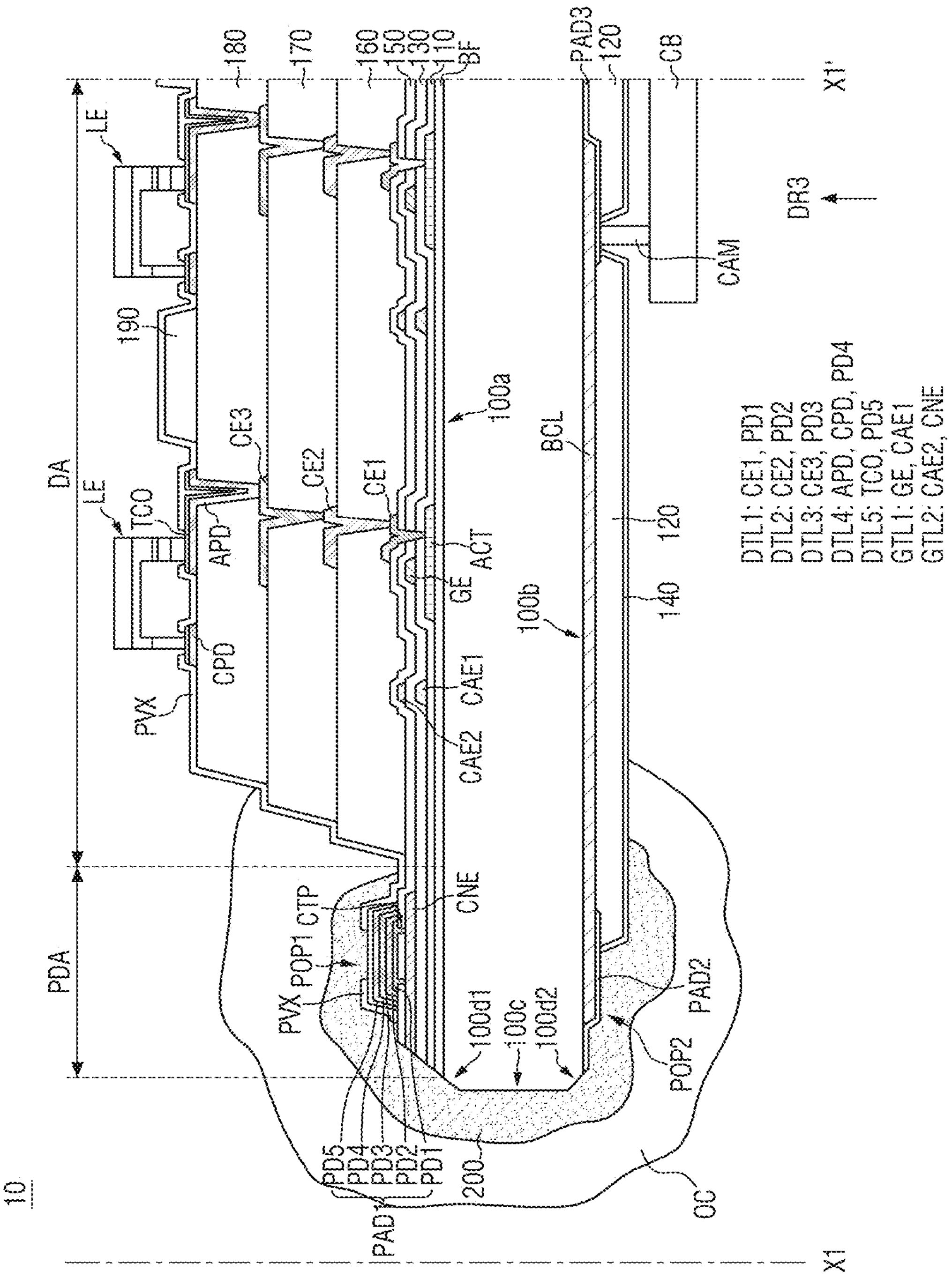
FIG. 9 is a cross-sectional view schematically illustrating a cross section taken along the line X1-X1' of FIG. 7.

The first pad PAD1 may be connected to the plurality of pixels PX by a top surface connection line CNE (see FIG. 9). In one or more embodiments, the top surface connection line CNE may be formed of the same layer as the above-described second gate metal layer GTL2 to be electrically connected to a transistor layer that transmits an electrical signal to the light-emitting element LE.

Referring to FIG. 8 in conjunction with FIG. 6, the plurality of second pads PAD2 may serve to transmit the electrical signal of the driver to the first pads PAD1 through the side surface line 200. The second pads PAD2 may be located on the second surface 100*b* of the substrate 100. The second pads PAD2 may be located at one edge of the second surface 100*b* of the substrate 100 in the first direction DR1. The second pads PAD2 may be arranged along the second direction DR2. The second pads PAD2 may be connected to the driver by the bottom surface connection lines BCL.

Each of the plurality of second pads PAD2 may have a shape extending in the second direction DR2. The side surface line 200 may expose a portion of each of the plurality of second pads PAD2. In other words, the width of the side surface line 200 in the second direction DR2 may be smaller than the width of each of the plurality of second pads PAD2 in the second direction DR2. In one or more embodiments, a portion of the second pad PAD2 may be exposed while protruding from the side surface line 200 toward the other side in the second direction DR2, but the present disclosure is not limited thereto. For example, a portion of the second pad PAD2 may be exposed while protruding from the side surface line 200 toward one side in the second direction DR2.

A portion of the second pad PAD2, which protrudes from the side surface line 200 in the second direction DR2, may not overlap the side surface line 200 in the third direction DR3, and serve as a part for inspecting the contactability of electrodes constituting the second pad PAD2. A portion of the second pad PAD2 overlapping the side surface line 200 may be a region where the plurality of electrodes constituting the second pad PAD2 are in contact with the side surface line 200.

The second pad PAD2 may be connected to the third pad PAD3 and the driver DRP located thereon via the bottom surface connection line BCL. The plurality of third pads PAD3 may serve to transmit electrical signals generated from the driver DRP to the second pads PAD2 via the bottom surface connection line BCL.

The third pads PAD3 may be located on the second surface 100*b* of the substrate 100. The third pads PAD3 may be located to be adjacent to the center of the second surface 100*b* of the substrate 100 compared to the second pads PAD2. The third pads PAD3 may be arranged along the second direction DR2. The third pads PAD3 may be arranged to correspond to terminals formed at the driver DRP. In other words, the third pads PAD3 may be arranged to correspond to the terminals formed on the circuit board CB of the driver DRP. In order to connect a larger number of third pads PAD3 to the circuit board CB, the gap between the third pads PAD3 adjacent to each other in the second direction DR2 may be smaller than the gap between the second pads PAD2 adjacent to each other in the second direction DR2.

Because the gap between the second pads PAD2 adjacent to each other in the first direction DR1 and the gap between the third pads PAD3 adjacent to each other in the first direction DR1 are different, the bottom surface connection line BCL may be bent at least once. The bottom surface connection line BCL may be integrally formed with the second pad PAD2 and the third pad PAD3. The second pad PAD2, the third pad PAD3, and the bottom surface connection line BCL may be formed as a single layer or multiple layers made of one or more of molybdenum (Mo), aluminum (Al), chromium (Cr), gold (Au), titanium (Ti), nickel (Ni), neodymium (Nd), and/or copper (Cu), and/or an alloy thereof.

Referring back to FIGS. 6 to 8, each of the side surface line 200 may include a first flat portion 210, a first inclined portion 240*a*, a connection portion 230, a second inclined portion 240*b*, and a second flat portion 220.

The first flat portion 210 of the side surface line 200 may be a portion located on the first surface 100*a* of the substrate 100, that is, in the pad area PDA of the first surface 100*a*. The first flat portion 210 of the side surface line 200 may be located on the first pad PAD1 to partially cover the first pad PAD1 and may be electrically connected to the first pad PAD1. The first flat portions 210 of the side surface line 200 may be spaced from each other in the second direction DR2.

The first inclined portion 240*a* of the side surface line 200 may be a portion located on the first chamfered surface 100*d*1 of the substrate 100. The first inclined portion 240*a* of the side surface line 200 may form a slope along a direction in which the first chamfering surface 100_d_1 is inclined. The first inclined portion 240_a_ of the side surface line 200 may be located between the first flat portion 210 and the connection portion 230 of the side surface line 200. The first inclined portions 240_a_ of the side surface line 200 may be spaced from each other in the second direction DR2.

The connection portion 230 of the side surface line 200 may be a portion located on the first side surface 100_c_ of the substrate 100. The connection portion 230 of the side surface line 200 may be located between the first inclined portion 240_a_ and the second inclined portion 240_b_ of the side surface line 200. The connection portions 230 of the side surface line 200 may be spaced from each other in the second direction DR2.

The second inclined portion 240_b_ of the side surface line 200 may be a portion located on the second chamfered surface 100_d_2 of the substrate 100. The second inclined portion 240_b_ of the side surface line 200 may form a slope along a direction in which the second chamfering surface 100_d_2 is inclined. The second inclined portion 240_b_ of the side surface line 200 may be located between the second flat portion 220 and the connection portion 230 of the side surface line 200. The second inclined portions 240_b_ of the side surface line 200 may be spaced from each other in the second direction DR2.

The second flat portion 220 of the side surface line 200 may be a portion located on the second surface 100_b_ of the substrate 100. The second flat portion 220 of the side surface line 200 may be located on the second pad PAD2 to partially cover the second pad PAD2. The second flat portion 220 of the side surface line 200 may be electrically connected to the second pad PAD2. The second flat portions 220 of the side surface line 200 may be spaced from each other in the second direction DR2.

The side surface line 200 may include a metal powder containing metal particles such as silver (Ag) and/or copper (Cu) and/or a polymer such as an acrylic resin and/or an epoxy resin. The metal powder may allow the side surface line 200 to have conductivity, and the polymer may serve as a binder connecting the metal particles. Hereinafter, for simplicity of description, a case where the side surface line 200 contains silver (Ag) will be mainly described.

The side surface line 200 may be formed by printing a metal paste containing metal particles, a monomer, and/or a solution on the substrate 100 using a silicon pad and then performing sintering using a laser. The metal particles are in close contact with each other and aggregated while the monomer reacts with the polymer by the heat generated by the laser in the sintering process, so that the corresponding resistance of the side surface line 200 may be lowered.

Hereinafter, the stacked structure of the above-described components will be described.

FIG. 9 is a cross-sectional view schematically illustrating a cross section taken along the line X1-X1' of FIG. 7.

Referring to FIG. 9, the first pad PAD1 may be located adjacent to the pixel PX located at the outermost part while being spaced apart therefrom, and the second pad PAD2 may be located on the second surface 100_b_ of the substrate 100.

Referring to FIG. 9 illustrating a structure of the first pad PAD1, the first pad PAD1 may include a first upper pad electrode PD1, a second upper pad electrode PD2, a third upper pad electrode PD3, a fourth upper pad electrode PD4, and a fifth upper pad electrode PD5.

In the pad area PDA, the first data metal layer DTL1 may further include the first upper pad electrode PD1, the second data metal layer DTL2 may further includes the second upper pad electrode PD2, the third data metal layer DTL3 may further includes the third upper pad electrode PD3, the fourth data metal layer DTL4 may further include the fourth upper pad electrode PD4, and the fifth data metal layer DTL5 may further include the fifth upper pad electrode PD5. In other words, the second upper pad electrode PD2 may be located on the first upper pad electrode PD1, the third upper pad electrode PD3 may be located on the second upper pad electrode PD2, the fourth upper pad electrode PD4 may be located on the third upper pad electrode PD3, and the fifth upper pad electrode PD5 may be located on the fourth upper pad electrode PD4.

The top surface of the first upper pad electrode PD1 may be in direct contact with the bottom surface of the second upper pad electrode PD2, the top surface of the second upper pad electrode PD2 may be in direct contact with the bottom surface of the third upper pad electrode PD3, the top surface of the third upper pad electrode PD3 may be in direct contact with the bottom surface of the fourth upper pad electrode PD4, and the top surface of the fourth upper pad electrode PD4 may be in direct contact with the bottom surface of the fifth upper pad electrode PD5.

The second upper pad electrode PD2 may be located on the first upper pad electrode PD1 to completely (e.g., substantially) cover the top and side surfaces of the first upper pad electrode PD1, the third upper pad electrode PD3 may be located on the second upper pad electrode PD2 to completely cover the top and side surfaces of the second upper pad electrode PD2, the fourth upper pad electrode PD4 may be located on the third upper pad electrode PD3 to completely cover the top and side surfaces of the third upper pad electrode PD3, and the fifth upper pad electrode PD5 may be located on the fourth upper pad electrode PD4 to completely cover the top and side surfaces of the fourth upper pad electrode PD4.

In other words, the planar area of the fifth upper pad electrode PD5 may be greater than that of the fourth upper pad electrode PD4, the planar area of the fourth upper pad electrode PD4 may be greater than that of the third upper pad electrode PD3, the planar area of the third upper pad electrode PD3 may be greater than that of the second upper pad electrode PD2, and the planar area of the second upper pad electrode PD2 may be greater than that of the first upper pad electrode PD1.

The first upper pad electrode PD1 of the first pad PAD1 may be located on the second interlayer insulating layer 150. The first upper pad electrode PD1 may be electrically connected to the top surface connection line CNE located on the first interlayer insulating layer 130 through the pad contact hole CTP penetrating the second interlayer insulating layer 150.

The upper passivation layer PVX may be located on the first pad PAD1 to form an upper pad opening POP1 that exposes the first pad PAD1. The first pad PAD1 may be in contact with the side surface line 200 through the upper pad opening POP1. Accordingly, the first pad PAD1 may be electrically connected to the side surface line 200.

The first upper pad electrode PD1, the second upper pad electrode PD2, the third upper pad electrode PD3, the fourth upper pad electrode PD4, and the fifth upper pad electrode PD5 may be arranged to overlap the side surface line 200 in the third direction DR3.

In the connection relationship between the second pad PAD2 and the above-described driver, the second pad PAD2 may be electrically connected to the third pad PAD3 via the bottom surface connection line BCL, and the circuit board CB may be located on the third pad PAD3.

The bottom surface connection line BCL may be located on the second surface 100*b* of the substrate 100 to extend in the first direction DR1. The bottom surface connection line BCL may be formed as a single layer or multiple layers made of one or more of molybdenum (Mo), aluminum (Al), chromium (Cr), gold (Au), titanium (Ti), nickel (Ni), neodymium (Nd), and/or copper (Cu) and/or an alloy thereof.

The third pad PAD3 may be located on the bottom surface connection line BCL. The third pad PAD3 may be made of a transparent conductive oxide such as indium tin oxide (ITO) and/or indium zinc oxide (IZO).

A lower via layer 120 may be located on the second surface 100*b* of the substrate 100. For example, the lower via layer 120 may be located on the other surface of the bottom surface connection line BCL in the third direction DR3. The lower via layer 120 may partially cover the second pad PAD2 and the third pad PAD3, and may expose at least a portion of the second pad PAD2 and at least a portion of the third pad PAD3. The second pad PAD2 exposed by the lower via layer 120 may be in direct contact with and electrically connected to the side surface line 200, and the third pad PAD3 exposed by the lower via layer 120 may be electrically connected to the circuit board CB by a conductive adhesive member CAM. The conductive adhesive member CAM may be an anisotropic conductive film or an anisotropic conductive paste.

The lower via layer 120 may be formed of an organic layer such as acryl resin, epoxy resin, phenolic resin, polyamide resin, polyimide resin and/or the like.

The lower passivation layer 140 may cover the lower via layer 120. The lower passivation layer 140 may be located on the second pad PAD2 and the third pad PAD3 to form openings exposing them. In other words, each of the second pad PAD2 and the third pad PAD3 may include a portion exposed by the lower passivation layer 140. The lower passivation layer 140 may form a lower pad opening POP2 at a portion that overlaps the side surface line 200 of the second pad PAD2.

The lower passivation layer 140 may be formed of an inorganic layer, e.g., a silicon nitride layer, a silicon oxynitride layer, a silicon oxide layer, a titanium oxide layer, and/or an aluminum oxide layer.

The side surface line 200 may be located on the first surface 100*a*, the first chamfered surface 100*d*1, the first side surface 100*c*, the second chamfered surface 100*d*2, and the second surface 100*b* of the substrate 100.

The side surface line 200 may be electrically connected to the first pad PAD1 located on the first surface 100*a* of the substrate 100. The side surface line 200 may be connected to the second pad PAD2 located on the second surface 100*b* of the substrate 100. The side surface line 200 may be in contact with the first chamfered surface 100*d*1, the first side surface 100*c*, and the second chamfered surface 100*d*2 of the substrate 100.

An overcoat layer OC may be located on the first surface 100*a*, the first chamfered surface 100*d*1, the first side surface 100*c*, the second chamfered surface 100*d*2, and the second surface 100*b* of the substrate 100. The overcoat layer OC may be located to cover the side surface line 200. For example, the overcoat layer OC may cover the side surface line 200. Accordingly, the overcoat layer OC may be in direct contact with the upper passivation layer PVX in a separation space between the side surface lines 200 located on the first surface 100*a* of the substrate 100, and in direct contact with the lower passivation layer 140 in a separation space between the side surface lines 200 located on the second surface 100*b* of the substrate 100.

The overcoat layer OC may cover the side surface line 200 to insulate the side surface line 200, and reduce or prevent visible recognition of the side surface line 200. Because the overcoat layer OC covers the side surface line 200 located thereunder, a level difference may be generated according to the thickness of the side surface line 200. For example, a region of the overcoat layer OC formed on the side surface line 200 may have a large thickness, and a region thereof formed between the side surface lines 200 may have a small thickness. The region of the overcoat layer OC having a large thickness may be subjected to a direct physical impact. In this case, because adhesion of the side surface line 200 to the substrate 100 is relatively low, the side surface line 200 may be delaminated by a physical impact.

Hereinafter, in the present disclosure, an overcoat layer, which is capable of reducing or preventing the likelihood of the side surface line 200 being delaminated by an external impact, will be described.

Figure 10:
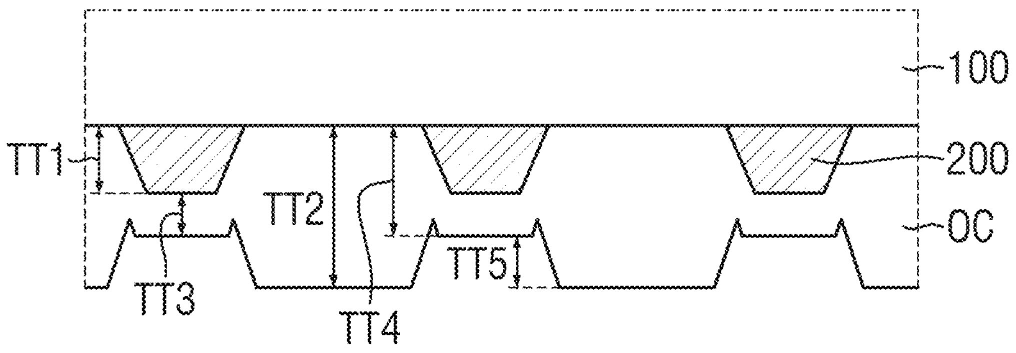
FIG. 10 is a plan view illustrating a side surface line and an overcoat layer of a display device according to one or more embodiments.
Figure 11:
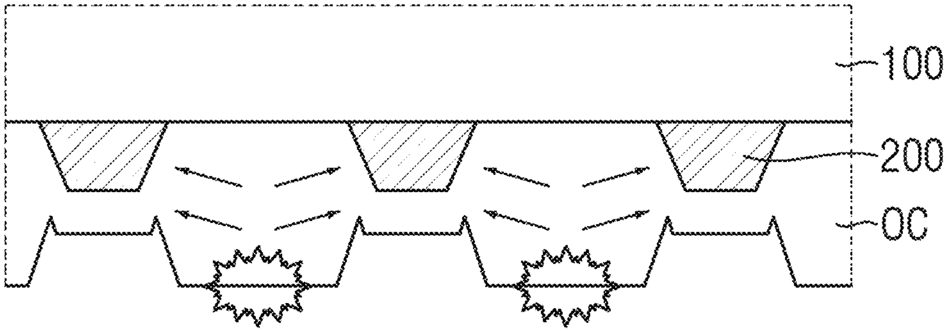
FIG. 11 is a diagram illustrating an impact dispersion mechanism when an impact is applied to an overcoat layer of a display device according to one or more embodiments.

FIG. 10 is a plan view illustrating a side surface line and an overcoat layer of a display device according to one or more embodiments. FIG. 11 is a diagram illustrating an impact dispersion mechanism when an impact is applied to an overcoat layer of a display device according to one or more embodiments.

FIGS. 10 and 11 illustrate top views of the first side surface 100*c*, the side surface line 200, and the overcoat layer OC of the substrate 100 by taking the substrate 100 of FIG. 9 in a horizontal direction.

Referring to FIGS. 10 and 11, the side surface lines 200 may be located on the first side surface 100*c* of the substrate 100, and the overcoat layer OC may be located on the side surface line 200 and the first side surface 100*c* of the substrate 100.

The side surface lines 200 may be located to be spaced from each other on the substrate 100. The side surface lines 200 may have a thickness TT1 in a range of about 3 μm to about 5 μm. The side surface line 200 may protrude from the side surface (the first side surface 100*c*) of the substrate 100 by the thickness TT1.

The overcoat layer OC may be located on the substrate 100 and the side surface lines 200. The overcoat layer OC may insulate the side surface lines 200 from each other and protect them from the outside. The overcoat layer OC may be in direct contact with the side surface of the substrate 100 and in direct contact with the top surfaces and the side surfaces of the side surface lines 200.

The overcoat layer OC may have stepped portions having different thicknesses due to a level difference between the substrate 100 and the side surface lines 200. The thickness of the overcoat layer OC may be different for each area.

For example, the overcoat layer OC may have a first thickness TT2 at a region not overlapping the side surface line 200 and a second thickness TT3 at a region overlapping the side surface line 200. The first thickness TT2 of the overcoat layer OC may be a distance from the side surface of the substrate 100 to the top surface of the overcoat layer OC. The second thickness TT3 of the overcoat layer OC may be a distance from the top surface of the side surface line 200 to the top surface of the overcoat layer OC. The first thickness TT2 of the overcoat layer OC may be greater than the second thickness TT3. For example, the first thickness TT2 of the overcoat layer OC may be in a range of about 11 μm to about 20 μm, and the second thickness TT3 of the overcoat layer OC may be in a range of about 5 μm to about 10 μm.

In one or more embodiments, the first thickness TT2 of the overcoat layer OC may be greater than a sum TT4 of the thickness TT1 of the side surface line 200 and the second thickness TT3 of the overcoat layer OC. For example, a distance from the side surface of the substrate 100 to the top surface of the overcoat layer OC at the region not overlapping the side surface line 200 may be greater than a distance from the side surface of the substrate 100 to the top surface of the overcoat layer OC at the region overlapping the side surface line 200.

Adhesion of the side surface line 200 to the substrate 100 may be lower than adhesion of the overcoat layer OC to the substrate 100. Accordingly, if an external impact is applied to the overcoat layer OC at the region overlapping the side surface line 200, the side surface line 200 may be delaminated. By forming the overcoat layer OC to have a greater thickness at the region not overlapping the side surface line 200, it is possible to reduce or prevent application of an impact to the side surface line 200.

To this end, a level difference TT5 of the overcoat layer OC may be in a range of about 1 μm to about 10 μm. The level difference TT5 of the overcoat layer OC may be a value obtained by subtracting the sum TT4 of the thickness TT1 of the side surface line 200 and the second thickness TT3 of the overcoat layer OC from the first thickness TT2 of the overcoat layer OC. Because the level difference TT5 of the overcoat layer OC is in the range of about 1 μm to about 10 μm, an external impact may be applied to the overcoat layer OC that does not overlap the side surface line 200. Accordingly, it is possible to prevent or reduce the side surface line 200 from being delaminated by the impact.

As shown in FIG. 11, because the region of the overcoat layer OC not overlapping the side surface line 200 protrudes more outward than the region of the overcoat layer OC overlapping the side surface line 200, an external impact may be applied to the region of the overcoat layer OC not overlapping the side surface line 200. In this case, the external impact may be dispersed within the overcoat layer OC, and thus the side surface line 200 may be prevented from being subjected to the impact.

As described above, in the display device 10 according to one or more embodiments, the overcoat layer OC is formed to have a greater thickness at the region not overlapping the side surface line 200 than at the region overlapping the side surface line 200, so that the side surface line 200 is prevented or protected from being delaminated by an external impact.

Figure 12:
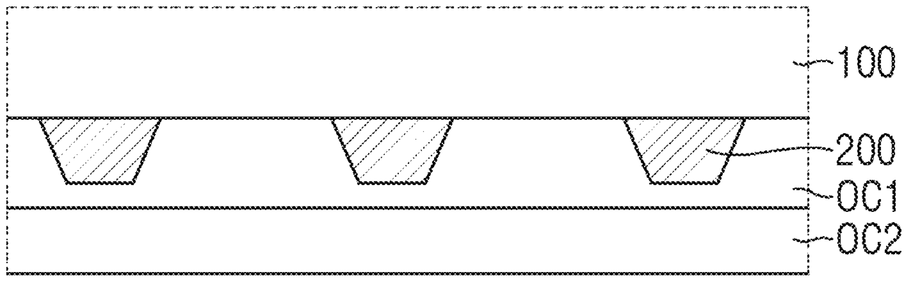
FIG. 12 is a plan view illustrating a side surface line and an overcoat layer of a display device according to one or more embodiments.
Figure 13:
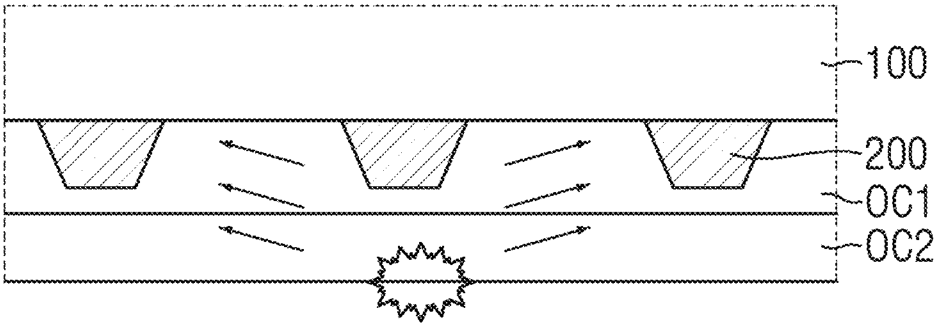
FIG. 13 is a diagram illustrating an impact dispersion mechanism when an impact is applied to an overcoat layer of a display device according to one or more embodiments.

FIG. 12 is a plan view illustrating a side surface line and an overcoat layer of a display device according to one or more embodiments. FIG. 13 is a diagram illustrating an impact dispersion mechanism when an impact is applied to an overcoat layer of a display device according to one or more embodiments.

Referring to FIGS. 12 and 13, in contrast to the one or more embodiments corresponding to FIGS. 10 and 11 described above in that a first overcoat layer OC1 and a second overcoat layer OC2 are located on the side surface line 200. In the following description, redundant description of the above-described embodiments will be omitted while focusing on differences.

The side surface lines 200 may be located on the first side surface 100*c* of the substrate 100, the first overcoat layer OC1 may be located on the side surface lines 200 and the first side surface 100*c* of the substrate 100, and the second overcoat layer OC2 may be located on the first overcoat layer OC1.

The first overcoat layer OC1 may be located on the substrate 100 and the side surface lines 200. The first overcoat layer OC1 may insulate the side surface lines 200 from each other and may flatten stepped portions between the side surface lines 200 and the substrate 100. The first overcoat layer OC1 may be a planarization layer. The first overcoat layer OC1 may be in direct contact with the side surface of the substrate 100 and may be in direct contact with the top surfaces and the side surfaces of the side surface lines 200.

The first overcoat layer OC1 may be formed of a first composition having a low viscosity to have planarization characteristics. The first composition for forming the first overcoat layer OC1 may include a binder and a solvent.

The binder may include at least one of a phenol formaldehyde resin, a urethane resin, an epoxy resin, and/or an acrylic resin. The binder may be included at about 30 wt % to about 60 wt % in the total content of the first composition. The solvent may be a commercially available solvent and may include, for example, water, ethanol, and/or the like. The solvent may be included at about 40 wt % to about 70 wt % in the total content of the first composition. The first composition may have a viscosity of about 1000 cp or less to have planarization characteristics. In one or more embodiments, the first composition may have a viscosity in a range of about 300 cp to about 1000 cp.

In one or more embodiments, without being limited to the first composition, the first overcoat layer OC1 may be formed of a polyimide and/or polyacrylate resin having a viscosity of about 100 cp or less. In this case, the first overcoat layer OC1 may be subjected to a surface treatment, such as an atmospheric pressure (AP) plasma treatment, for adhesion characteristics with respect to the second overcoat layer OC2.

The second overcoat layer OC2 may prevent or protect the side surface line 200 from being visibly recognized and protect the first overcoat layer OC1 and the side surface line 200. The second overcoat layer OC2 may be located entirely on the top surface of the first overcoat layer OC1 and may be in direct contact therewith. The second overcoat layer OC2 may be the same as the above-described overcoat layer OC of FIGS. 10 and 11.

The second overcoat layer OC2 may be formed of a second composition. The second composition for forming the second overcoat layer OC2 may include a binder, a solvent, and/or an additive.

The binder may include the same material as the first composition described above, and may be included in the total second composition at about 30 wt % to about 60 wt %. The solvent may include the same material as the first composition described above, and may be included in the total second composition at about 20 wt % to about 40 wt %.

The additive may include a black pigment and a filler. The black pigment may include carbon black and/or lactam black. The filler may include inorganic particles to improve reliability against high temperature and humidity. The inorganic particles may include at least one of calcium carbonate ($CaCO_3$) and/or silica ($SiO_2$). The additive may be included in the total second composition at about 10 wt % to about 30 wt %. However, the present disclosure is not limited thereto, and in one or more embodiments, calcium carbonate may be omitted. In one or more embodiments, the first overcoat layer OC1 may not include a black pigment and a filler. The second composition may have a viscosity of about 4000 cp or less for coatability. In one or more embodiments, the second composition may have a viscosity in a range of about 2000 cp to about 4000 cp.

In one or more embodiments, the thickness of the first overcoat layer OC1 may be greater than the thickness of the side surface line 200. That is, the first overcoat layer OC1 may be located to completely cover the side surface line 200. The second overcoat layer OC2 may be formed to have a sufficiently large thickness such that a level difference of about 1 μm or less may be formed. For example, the second overcoat layer OC2 may have a thickness in a range of about 5 μm to about 10 μm.

As shown in FIG. 13, the second overcoat layer OC2 may be formed substantially flat. When an external impact is applied to the second overcoat layer OC2, the external impact may be dispersed within the second overcoat layer OC2 and the first overcoat layer OC1 so that the impact is prevented or protected from being applied to the side surface line 200.

As described above, in the display device 10 according to one or more embodiments, because the surface thereof is flattened by forming the first overcoat layer OC1 and the second overcoat layer OC2, the side surface line 200 may be prevented or protected from being delaminated by an external impact.

Figure 14:
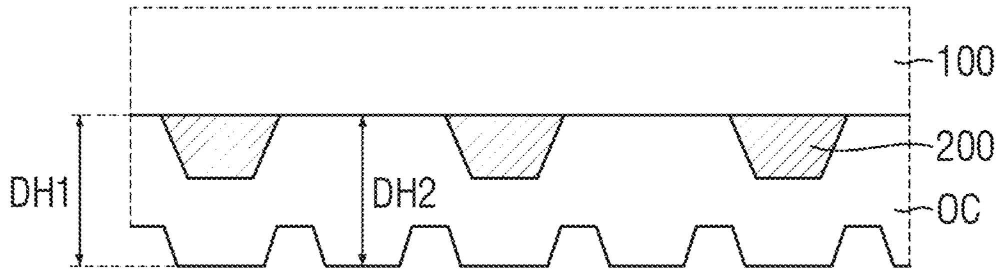
FIG. 14 is a plan view showing a side surface line and an overcoat layer of a display device according to one or more embodiments.

FIG. 14 is a plan view illustrating a side surface line and an overcoat layer of a display device according to one or more embodiments.

Referring to FIG. 14, the present embodiment is different from the embodiment of FIGS. 10 and 11 in that a distance from the side surface of the substrate 100 to the top surface of the overcoat layer OC is the same in a region overlapping the side surface line 200 and a region not overlapping the side surface line 200.

The side surface lines 200 may be disposed on the substrate 100, and the overcoat layer OC may be disposed on the side surface lines 200. The overcoat layer OC may cover the side surface lines 200 to insulate them from each other and protect the side surface lines 200 from the outside.

The overcoat layer OC may have a distance (or height) measured from the side surface of the substrate 100 to the top surface thereof. Here, the top surface of the overcoat layer OC may be the uppermost surface of the overcoat layer OC disposed farthest from the side surface of the substrate 100. The overcoat layer OC may have a region overlapping the side surface line 200 and a region not overlapping the side surface line 200. The overcoat layer OC may have a first distance DH1 measured from the side surface of the substrate 100 to the top surface of the overcoat layer OC in the region overlapping the side surface line 200, and a second distance DH2 measured from the side surface of the substrate 100 to the top surface of the overcoat layer OC in the region not overlapping the side surface line 200.

In this embodiment, the first distance DH1 and the second distance DH2 may be the same. In an exemplary embodiment, the distance from the side surface of the substrate 100 to the top surface, for example, the uppermost surface, of the overcoat layer OC may be the same in the regions which overlap and do not overlap the side surface line 200. If the distance from the side surface of the substrate 100 to the top surface of the overcoat layer OC is the same regardless of the region, no matter where an impact is applied to the overcoat layer OC, the impact is distributed within the overcoat layer OC, thereby preventing the impact from being transmitted to the side surface line 200.

Hereinafter, a method of manufacturing a display device including the above-described overcoat layer will be described with reference to other drawings.

Figure 15:
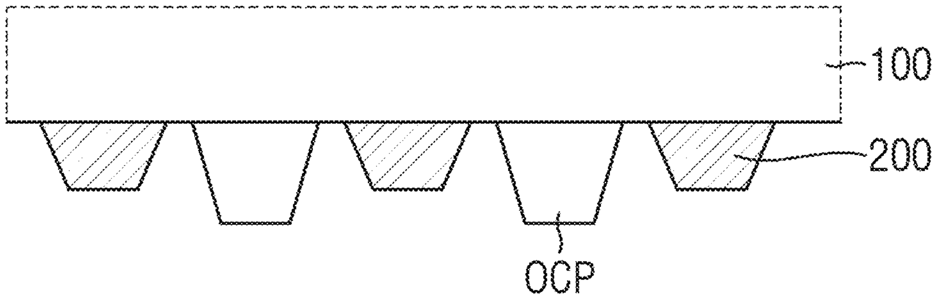
FIGS. 15 and 16 are views for fabricating a side surface line and an overcoat layer of a display device according to one or more embodiments.
Figure 16:
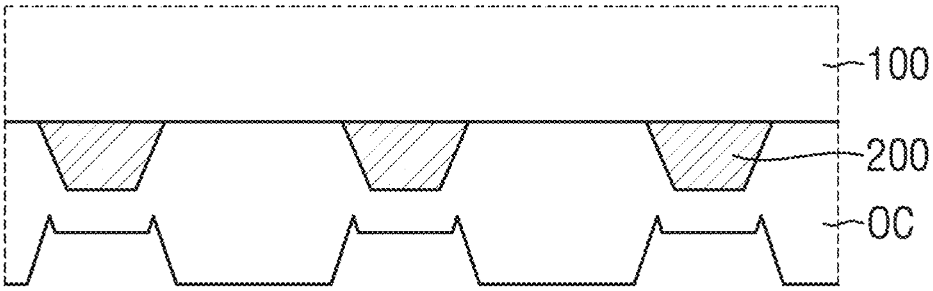

FIGS. 15 and 16 are views for fabricating a side surface line and an overcoat layer of a display device according to one or more embodiments. For example, FIGS. 15 and 16 show a process of manufacturing the side surface line and the overcoat layer shown in FIG. 10 described above.

Referring to FIG. 15, the substrate 100 is prepared. The substrate 100 may be a substrate in which all components have been formed except the above-described light-emitting element LE of FIG. 5.

The side surface line 200 is formed on the side surface of the substrate 100. The side surface line 200 may be formed through a printing and sintering process. In the printing process, metal ink may be printed on the side surface of the substrate 100 after mounting the substrate 100 on a stage. For example, metal ink, such as silver (Ag) paste, may be applied to the side surface of the substrate 100 by a printing device that sprays ink to the lower side of the silicon pad. In one or more embodiments, the silver paste may be applied using a gravure offset method. The sintering process of the silver paste may be a process of removing solvents other than silver from the silver paste applied to the side surface of the substrate 100 and drying it.

Then, a pattern layer OCP is formed on the side surface of the substrate 100 where the side surface line 200 has been formed. The pattern layer OCP may be formed between the side surface lines 200 while being spaced from the side surface lines 200. The patterned layer OCP may be formed parallel to the side surface lines 200. The pattern layer OCP is formed to have a thickness greater than the thickness of the side surface line 200 so that the overcoat layer OC, which will be described later, may be formed with a large thickness.

The pattern layer OCP may be applied using the same gravure offset method as the fabricating method of the side surface line 200 described above. The pattern layer OCP may be formed of a composition for fabricating the second overcoat layer OC2 as described above. For example, a composition including a binder, a solvent, and/or an additive may be printed on the side surface of the substrate 100 using the gravure offset method. The composition for forming the pattern layer OCP may be subjected to a sintering process to remove the solvent, thereby forming the pattern layer OCP.

Next, referring to FIG. 16, the overcoat layer OC is formed on the side surface of the substrate 100 where the side surface line 200 and the pattern layer OCP have been formed. The overcoat layer OC may be formed of the same material as the pattern layer OCP. For example, a composition for fabricating the overcoat layer OC is printed on the side surface of the substrate 100, on which the side surface line 200 and the pattern layer OCP have been formed, using a gravure offset method. In this case, the composition for fabricating the overcoat layer OC may be printed to completely cover the side surface line 200 and the pattern layer OCP. Subsequently, the composition for forming the overcoat layer OC may be formed as the overcoat layer OC by removing the solvent through a sintering process.

The overcoat layer OC may be formed to have different thicknesses along the lower step. For example, the overcoat layer OC may be formed to have a large thickness on the pattern layer OCP and have a relatively small thickness on the side surface line 200. The overcoat layer OC may be formed of the same composition as the pattern layer OCP, so that the pattern layer OCP and the overcoat layer OC may be integrated to be formed as the overcoat layer OC finally.

Then, the light-emitting element LE (see FIG. 5) may be formed on the substrate 100 through a transfer process, thereby manufacturing a display device according to one or more embodiments.

One or more embodiments, if the thickness of the side surface lines 200 and the thickness of the pattern layer OCP of FIG. 15 are formed to be equal, the structure of the overcoat layer OC and the side surface lines 200 according to the structure of FIG. 14 described above may be manufactured.

Figure 17:
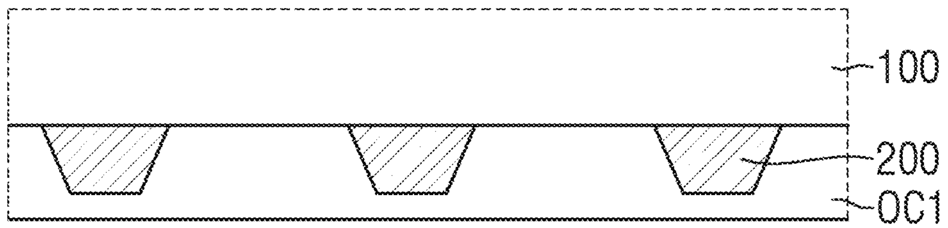
FIGS. 17 and 18 are views for fabricating a side surface line and an overcoat layer of a display device according to one or more embodiments.
Figure 18:
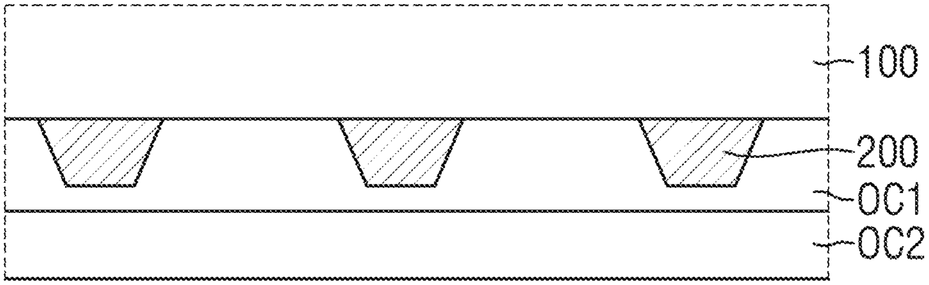

FIGS. 17 and 18 are views for fabricating a side surface line and an overcoat layer of a display device according to one or more embodiments. FIGS. 17 and 18 illustrate a method for fabricating the side surface line and the overcoat layers OC1 and OC2 according to the one or more embodiments corresponding to FIG. 12 described above.

Referring to FIG. 17, the side surface line 200 is formed on the side surface of the substrate 100 as shown in FIG. 15 described above. Then, the first overcoat layer OC1 is formed on the side surface of the substrate 100. The first overcoat layer OC1 may be formed to cover the side surface of the substrate 100 and the side surface line 200. The first overcoat layer OC1 may be formed to have a thickness greater than the thickness of the side surface line 200.

The first overcoat layer OC1 may be formed of a composition for fabricating the first overcoat layer OC1. For example, a composition including a binder and/or a solvent may be printed on the side surface of the substrate 100 using a printing method such as a gravure offset method. The composition for fabricating the first overcoat layer OC1 may have a viscosity of about 1000 cp or less, so that the surface may be formed to be substantially flat. Thereafter, the composition for fabricating the first overcoat layer OC1 may be subjected to a sintering process to remove the solvent, thereby forming the first overcoat layer OC1.

Next, referring to FIG. 18, the second overcoat layer OC2 is formed on the side surface of the substrate 100 where the first overcoat layer OC1 has been formed. The second overcoat layer OC2 may be formed of the same material as the overcoat layer of FIG. 16 described above. For example, a composition for fabricating the second overcoat layer OC2 is printed on the side surface of the substrate 100 where the first overcoat layer OC1 has been formed, using a gravure offset method. In this case, the composition for fabricating the second overcoat layer OC2 may be printed with a flat surface due to the flat first overcoat layer OC1. Then, the composition for forming the second overcoat layer OC2 may be subjected to a sintering process to remove the solvent, thereby forming the second overcoat layer OC2.

Subsequently, the light-emitting element LE (see FIG. 5) may be formed on the substrate 100 through a transfer process, so that the display device according to one or more embodiments may be manufactured.

Figure 19:
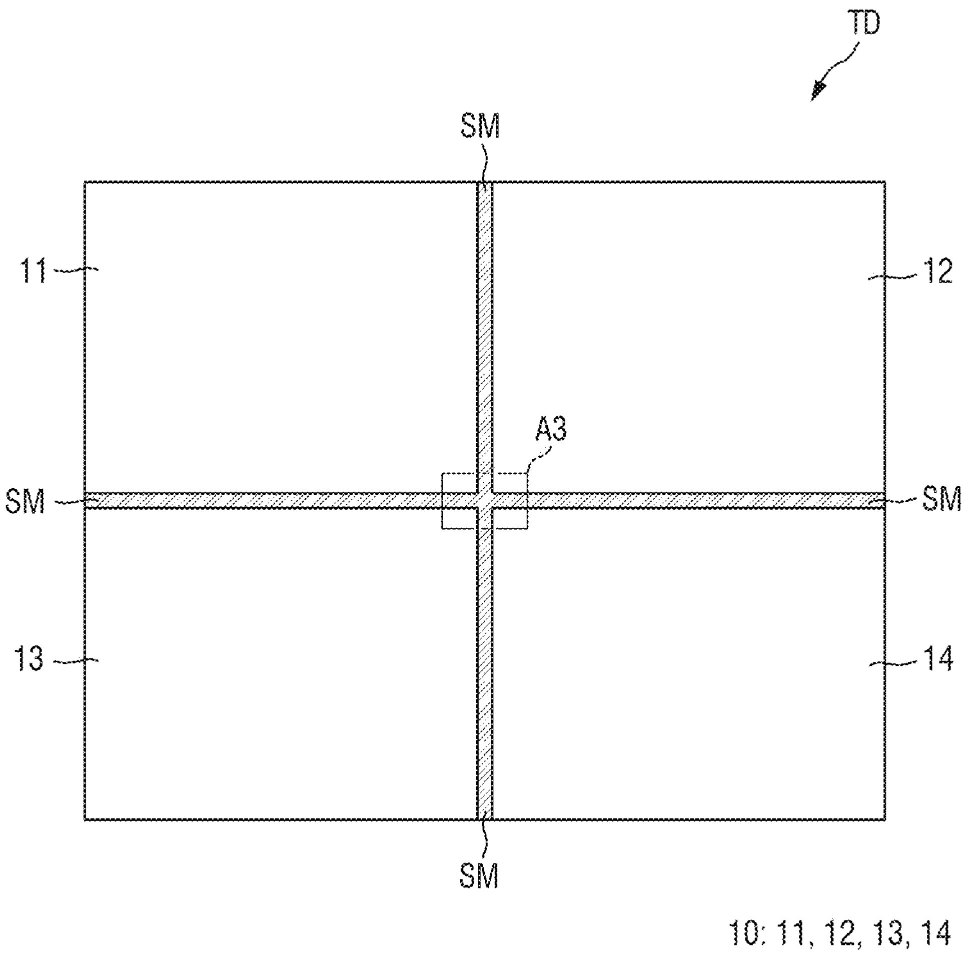
FIG. 19 is a plan view schematically illustrating a tiled display using a display device according to one or more embodiments.
Figure 20:
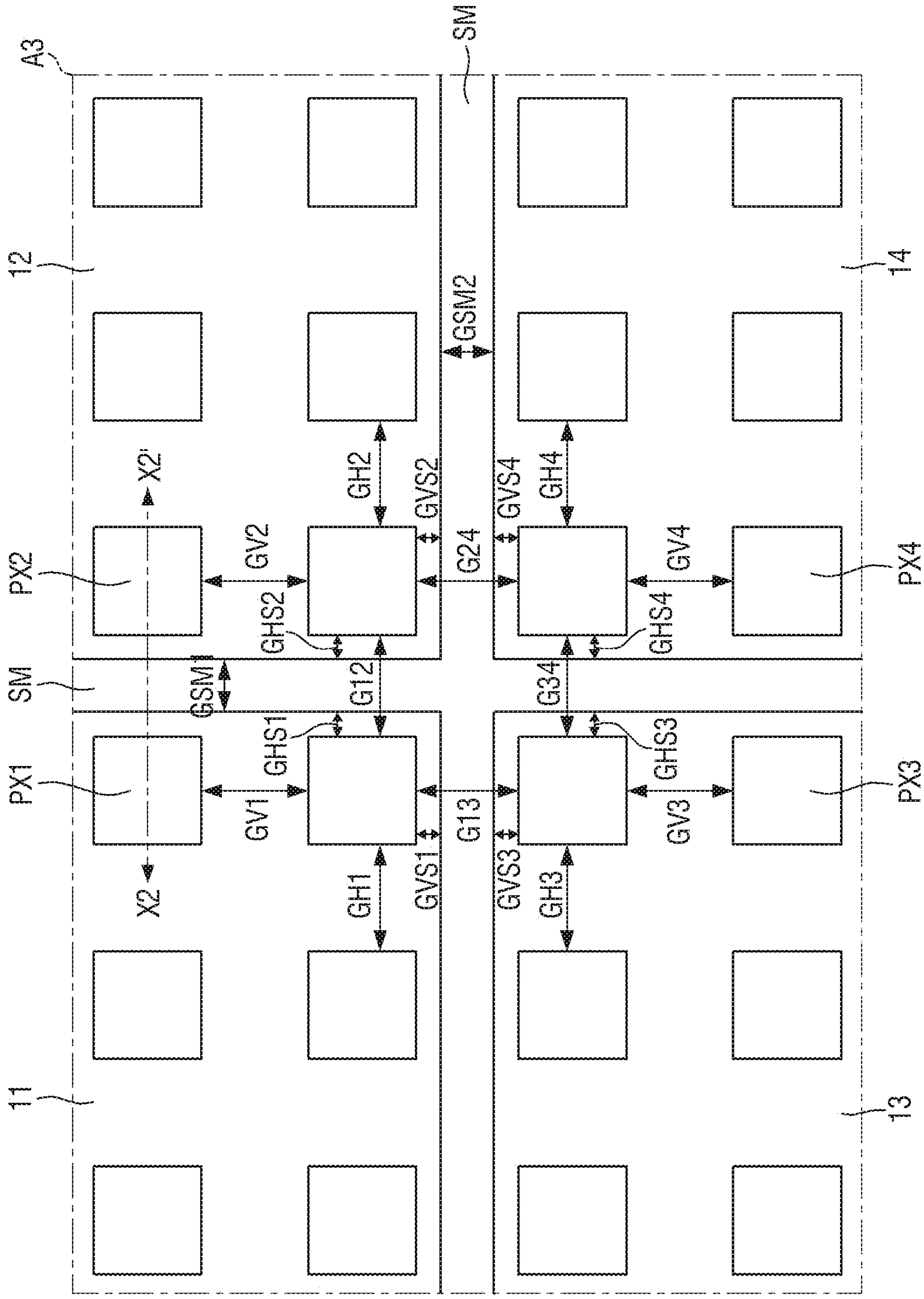
FIG. 20 is an enlarged view of an area A3 of FIG. 19.
Figure 21:
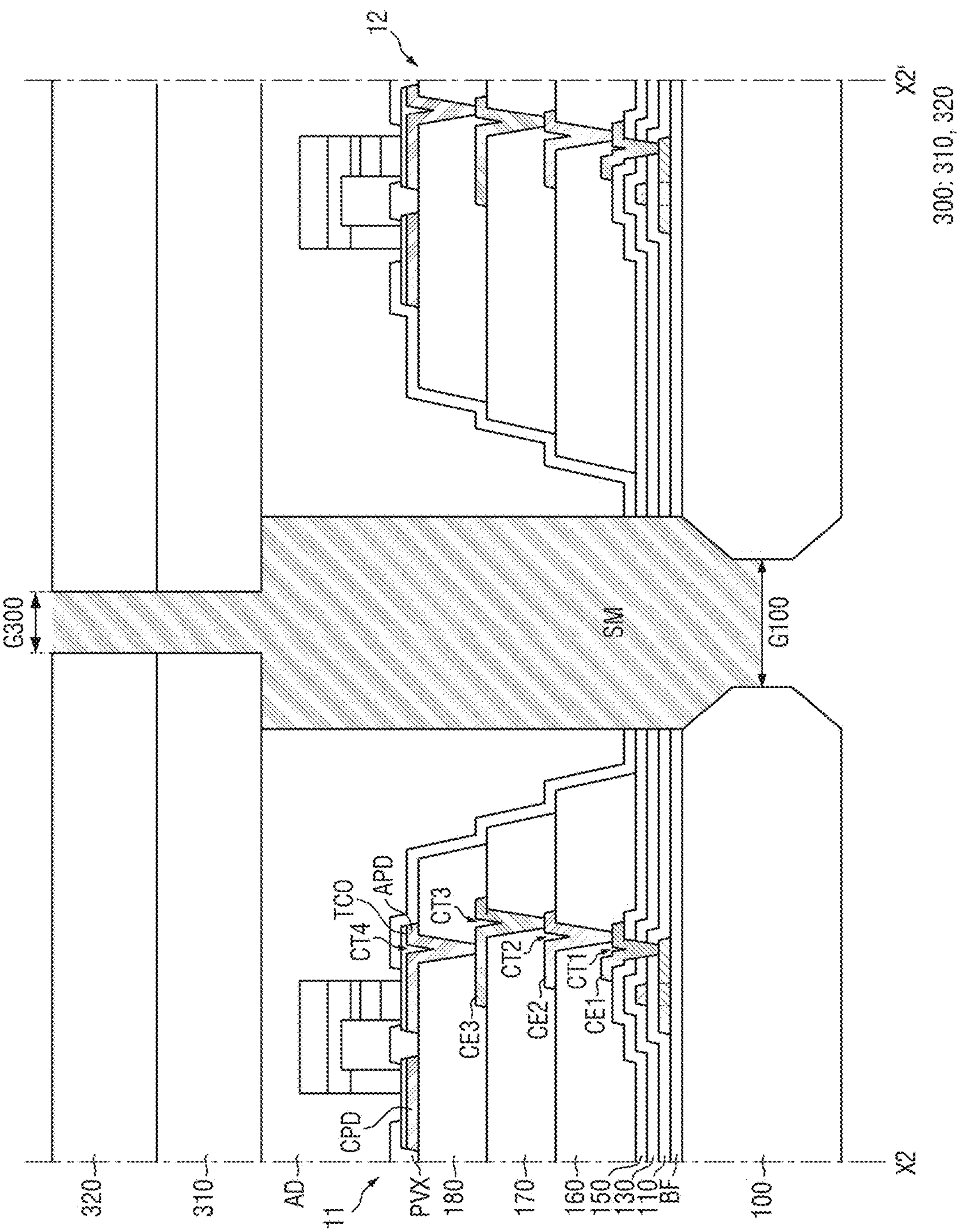
FIG. 21 is a cross-sectional view schematically illustrating a cross section taken along the line X2-X2' of FIG. 20.

FIG. 19 is a plan view schematically illustrating a tiled display using a display device according to one or more embodiments. FIG. 20 is an enlarged view of an area A3 of FIG. 19. FIG. 21 is a cross-sectional view schematically illustrating a cross section taken along the line X2-X2' of FIG. 20.

Referring to FIGS. 19 to 21, a tiled display device TD may include a plurality of display devices 10, a seam SM, and a front cover 300. For simplicity of description, depending on the relative positional relationships of the plurality of display devices 10 shown in FIG. 19, the display device 10 located at the upper left portion is referred to as a 'first display device 11', the display device 10 located at the upper right portion is referred to as a 'second display device 12', the display device 10 located at the lower left portion is referred to as a 'third display device 13', and the display device 10 located at the lower right portion is referred to as a 'fourth display device 14'. Although FIG. 18 illustrates that the tiled display device TD includes four display devices 10, i.e., the first display device 11, the second display device 12, the third display device 13, and the fourth display device 14, the number of display devices 10 that may be included in the tiled display device TD is not limited thereto. In the present disclosure, the tiled display device TD may be referred to as a tiled display device.

The plurality of display devices 11, 12, 13, and 14 may be arranged in a grid shape. The plurality of display devices 11, 12, 13, and 14 may be arranged in a matrix form in M (M being a positive integer) rows and N (N being a positive integer) columns. Although FIG. 18 illustrates that the first display device 11 and the second display device 12 are adjacent to each other in the first direction DR1, the first display device 11 and the third display device 13 are adjacent to each other in the second direction DR2, the third display device 13 and the fourth display device 14 are adjacent to each other in the first direction DR1, and the second display device 12 and the fourth display device 14 are adjacent to each other in the second direction DR2, the arrangement of the plurality of display devices constituting the tiled display device TD is not limited thereto.

That is, in the tiled display device TD, the number and arrangement of display devices may be determined by the size of each of the display device 10 and the tiled display device TD and the shape of the tiled display device TD. Hereinafter, for simplicity of description, a case where the tiled display device TD includes four display devices, and the plurality of display devices 11, 12, 13, and 14 are arranged in two rows and two columns will be mainly described.

The plurality of display devices 11, 12, 13, and 14 constituting the tiled display device TD may have the same size, but the present disclosure is not limited thereto. For example, the plurality of display devices 11, 12, 13, and 14 may have different sizes.

Each of the plurality of display devices 11, 12, 13, and 14 may have a rectangular shape including long sides and short sides. The plurality of display devices 11, 12, 13, and 14 may be located such that the long sides or the short sides thereof are connected to each other. Some or all of the plurality of display devices 11, 12, 13, and 14 may be located at the edge of the tiled display device TD, and may form one side of the tiled display device TD. At least one display device 10 of the plurality of display devices 11, 12, 13, and 14 may be located at at least one corner of the tiled display device TD, and may form two adjacent sides of the tiled display device TD. At least one of the plurality of display devices 11, 12, 13, and/or 14 may be surrounded by other display devices.

Each of the plurality of display devices 11, 12, 13, and 14 may be substantially the same as the display device 10 described in conjunction with FIG. 1. Therefore, a description of each of the plurality of display devices 11, 12, 13, and 14 will be omitted.

The seam SM may include a coupling member or an adhesive member. In this case, the plurality of display devices 11, 12, 13, and 14 may be connected to each other by the coupling member or the adhesive member of the seam SM. The seam SM may be located between the first display device 11 and the second display device 12, between the first display device 11 and the third display device 13, between the second display device 12 and the fourth display device 14, and between the third display device 13 and the fourth display device 14.

Referring to FIG. 20, the seam SM may have a shape of a cross (+) or a plus sign (+) in a plan view in the central region of the tiled display device TD in which the first display device 11, the second display device 12, the third display device 13, and the fourth display device 14 are adjacent to each other. The seam SM may be located between the first display device 11 and the second display device 12, between the first display device 11 and the third display device 13, between the second display device 12 and the fourth display device 14, and between the third display device 13 and the fourth display device 14.

The first display device 11 may include the first pixels PX1 arranged in a matrix form in a row direction (horizontal direction in FIG. 18) and a column direction (vertical direction in FIG. 18) crossing the row direction to display an image. The second display device 12 may include second pixels PX2 arranged in a matrix form in the row direction and the column direction to display an image. The third display device 13 may include third pixels PX3 arranged in a matrix form in the row direction and the column direction to display an image. The fourth display device 14 may include fourth pixels PX4 arranged in a matrix form in the row direction and the column direction to display an image. Because the first pixel PX1, the second pixel PX2, the third pixel PX3, and the fourth pixel PX4 are substantially the same as the pixel PX of the display device 10 described above, the detailed description of the structure of the first pixel PX1, the second pixel PX2, the third pixel PX3, and the fourth pixel PX4 will be omitted.

A minimum distance between the first pixels PX1 adjacent in the first direction DR1 may be defined as a first horizontal separation distance GH1, and a minimum distance between the second pixels PX2 adjacent in the first direction DR1 may be defined as a second horizontal separation distance GH2. The first horizontal separation distance GH1 and the second horizontal separation distance GH2 may be substantially the same.

The seam SM may be located between the first pixel PX1 and the second pixel PX2 adjacent in the row direction. A minimum distance G12 between the first pixel PX1 and the second pixel PX2 adjacent in the row direction may be the sum of a minimum distance GHS1 between the first pixel PX1 and the seam SM in the row direction, a minimum distance GHS2 between the second pixel PX2 and the seam SM in the row direction, and a width GSM1 of the seam SM in the row direction.

The minimum distance G12 between the first pixel PX1 and the second pixel PX2 adjacent in the row direction, the first horizontal separation distance GH1, and the second horizontal separation distance GH2 may be substantially the same. To this end, the minimum distance GHS1 between the first pixel PX1 and the seam SM in the row direction may be smaller than the first horizontal separation distance GH1, and the minimum distance GHS2 between the second pixel PX2 and the seam SM in the row direction may be smaller than the second horizontal separation distance GH2. In addition, the width GSM1 of the seam SM in the row direction may be smaller than the first horizontal separation distance GH1 or the second horizontal separation distance GH2.

A minimum distance between the third pixels PX3 adjacent in the row direction may be defined as a third horizontal separation distance GH3, and a minimum distance between the fourth pixels PX4 adjacent in the row direction may be defined as a fourth horizontal separation distance GH4. The third horizontal separation distance GH3 and the fourth horizontal separation distance GH4 may be substantially the same.

The seam SM may be located between the third pixel PX3 and the fourth pixel PX4 adjacent in the row direction. A minimum distance G34 between the third pixel PX3 and the fourth pixel PX4 adjacent in the row direction may be the sum of a minimum distance GHS3 between the third pixel PX3 and the seam SM in the row direction, a minimum distance GHS4 between the fourth pixel PX4 and the seam SM in the row direction, and a width GSM1 of the seam SM in the row direction.

The minimum distance G34 between the third pixel PX3 and the fourth pixel PX4 adjacent in the first direction DR1, the third horizontal separation distance GH3, and the fourth horizontal separation distance GH4 may be substantially the same. To this end, the minimum distance GHS3 between the third pixel PX3 and the seam SM in the row direction may be smaller than the third horizontal separation distance GH3, and the minimum distance GHS4 between the fourth pixel PX4 and the seam SM in the row direction may be smaller than the fourth horizontal separation distance GH4. In addition, the width GSM1 of the seam SM in the row direction may be smaller than the third horizontal separation distance GH3 or the fourth horizontal separation distance GH4.

The minimum distance between the first pixels PX1 adjacent in the column direction may be defined as a first vertical separation distance GV1, and the minimum distance between the third pixels PX3 adjacent in the column direction may be defined as a third vertical separation distance GV3. The first vertical separation distance GV1 and the third vertical separation distance GV3 may be substantially the same.

The seam SM may be located between the first pixel PX1 and the third pixel PX3 adjacent in the column direction. A minimum distance G13 between the first pixel PX1 and the third pixel PX3 adjacent in the column direction may be the sum of a minimum distance GVS1 between the first pixel PX1 and the seam SM in the column direction, a minimum distance GVS3 between the third pixel PX3 and the seam SM in the column direction, and a width GSM2 of the seam SM in the column direction.

The minimum distance G13 between the first pixel PX1 and the third pixel PX3 adjacent in the column direction, the first vertical separation distance GV1, and the third vertical separation distance GV3 may be substantially the same. To this end, the minimum distance GVS1 between the first pixel PX1 and the seam SM in the column direction may be smaller than the first vertical separation distance GV1, and the minimum distance GVS3 between the third pixel PX3 and the seam SM in the column direction may be smaller than the third vertical separation distance GV3. Further, the width GSM2 of the seam SM in the column direction may be smaller than the first vertical separation distance GV1 or the third vertical separation distance GV3.

The minimum distance between the second pixels PX2 adjacent in the column direction may be defined as a second vertical separation distance GV2, and the minimum distance between the fourth pixels PX4 adjacent in the column direction may be defined as a fourth vertical separation distance GV4. The second vertical separation distance GV2 and the fourth vertical separation distance GV4 may be substantially the same.

The seam SM may be located between the second pixel PX2 and the fourth pixel PX4 adjacent in the column direction. A minimum distance G24 between the second pixel PX2 and the fourth pixel PX4 adjacent in the column direction may be the sum of a minimum distance GVS2 between the second pixel PX2 and the seam SM in the column direction, a minimum distance GVS4 between the fourth pixel PX4 and the seam SM in the column direction, and the width GSM2 of the seam SM in the column direction.

The minimum distance G24 between the second pixel PX2 and the fourth pixel PX4 adjacent in the column direction, the second vertical separation distance GV2, and the fourth vertical separation distance GV4 may be substantially the same. To this end, the minimum distance GVS2 between the second pixel PX2 and the seam SM in the column direction may be smaller than the second vertical separation distance GV2, and the minimum distance GVS4 between the fourth pixel PX4 and the seam SM in the column direction may be smaller than the fourth vertical separation distance GV4. Further, the width GSM2 of the seam SM in the column direction may be smaller than the second vertical separation distance GV2 or the fourth vertical separation distance GV4.

To reduce or prevent visible recognition of the seam SM between images displayed by the plurality of display devices 11, 12, 13, and 14, the minimum distance between the pixels PX of adjacent display devices 10 may be substantially the same as the minimum distance between the pixels PX of each of the display devices 10 as shown in FIG. 20.

Referring to FIG. 21, the plurality of front covers 300 may be located above each of the plurality of display devices 11, 12, 13 and 14. For simplicity of description, the front cover 300 located above the first display device 11 is referred to as "first front cover," and the front cover 300 located above the second display device 12 is referred to as "second front cover," the front cover 300 located above the third display device 13 is referred to as "third front cover," and the front cover 300 located above the fourth display device 14 is referred to as "fourth front cover." The plurality of display devices 11, 12, 13, and 14 and the plurality of front covers 300 corresponding thereto may be bonded to each other by an adhesive member AD.

FIG. 21 illustrates the arrangement structure of the first display device 11 and the second display device 12 and the first front cover and the second front cover respectively corresponding thereto. Because the arrangement structure of the third display device 13 and the fourth display device 14 and the third front cover and the fourth front cover corresponding thereto is substantially the same as the arrangement structure of the first display device 11 and the second display device 12 and the first front cover and the second front cover corresponding thereto, the first front cover and the second front cover will be mainly described hereinafter, and the detailed description of the third front cover and the fourth front cover will be omitted.

The first front cover may be located on the first display device 11 and protrude more than the substrate 100 of the first display device 11. Therefore, a gap G100 between the substrate 100 of the first display device 11 and the substrate 100 of the second display device 12 may be greater than a gap G300 between the first front cover and the second front cover.

Each of the plurality of front covers 300 may include a light transmittance control layer 310 and an anti-glare layer 320.

As described above, each of the plurality of front covers 300 may be adhered to the display device 10 corresponding thereto by the adhesive member AD. The adhesive member AD may be a transparent adhesive member capable of transmitting light. For example, the adhesive member AD may be an optically clear adhesive film or an optically clear resin.

The light transmittance control layer 310 may be located on the adhesive member AD. The light transmittance control layer 310 may be designed to reduce transmittance of external light or light reflected from the first display device 11 and the second display device 12. Further, because the front cover 300 protrudes more than the substrate 100 as described above, the light transmittance control layer 310 included in the front cover 300 may also protrude more than the substrate 100. Accordingly, the gap G100 between the substrate 100 of the first display device 11 and visual recognition of the substrate 100 of the second display device 12 from the outside may be reduced or prevented.

The anti-glare layer 320 may be located on the light transmittance control layer 310. The anti-glare layer 320 may be designed to diffusely reflect external light to prevent or reduce a decrease in visibility of an image due to reflection of external light. Accordingly, the contrast ratio of images displayed by the first display device 11 and the second display device 12 may be increased due to the anti-glare layer 320.

The anti-glare layer 320 may be implemented as a polarizing plate, and the light transmittance control layer 310 may be implemented as a phase delay layer, but the present disclosure is not limited thereto.

Hereinafter, a driving method of the tiled display device TD according to one or more embodiments will be described.

Figure 22:
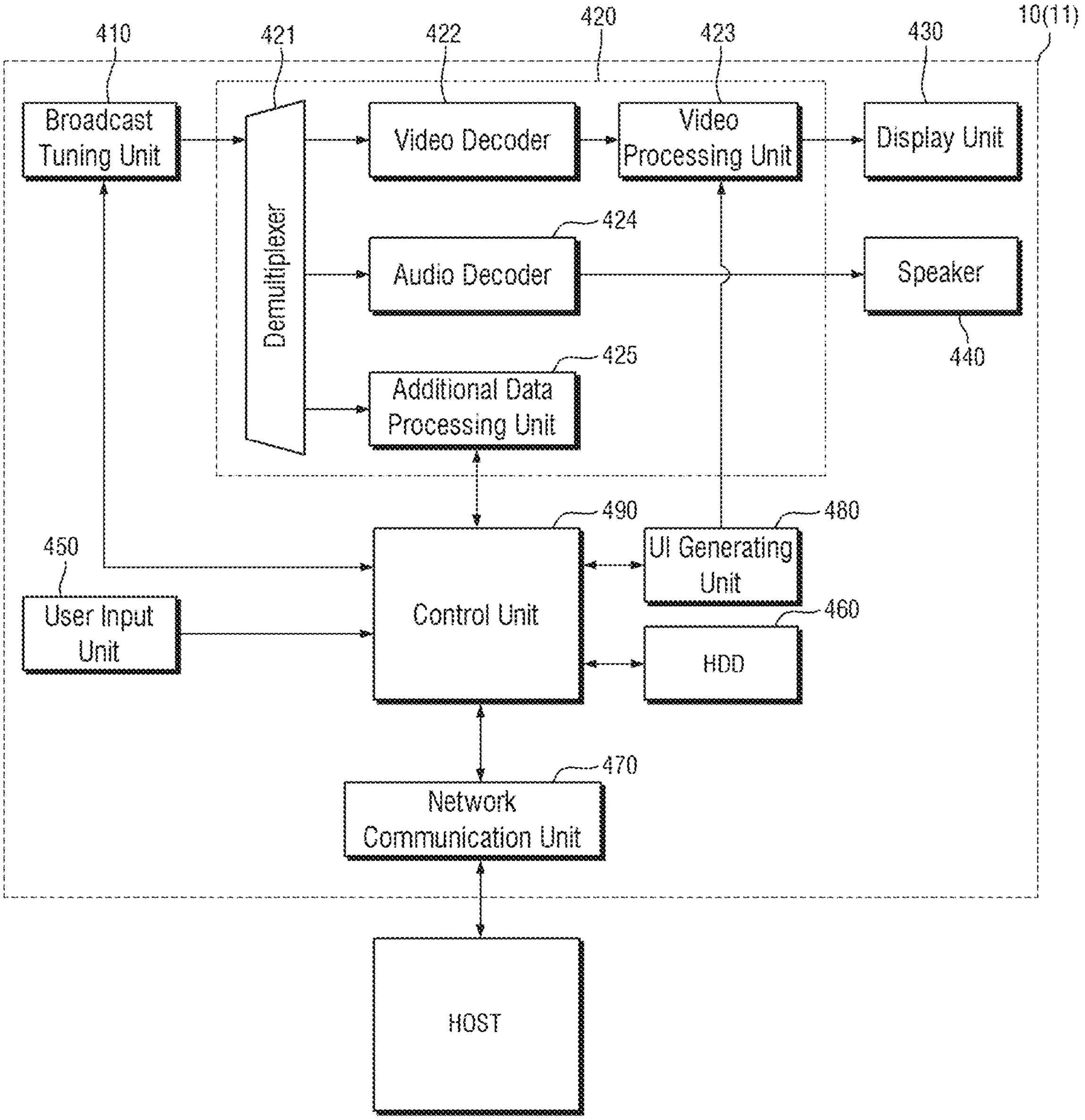
FIG. 22 is a block diagram illustrating a structure of a tiled display device according to one or more embodiments.
Figure 23:
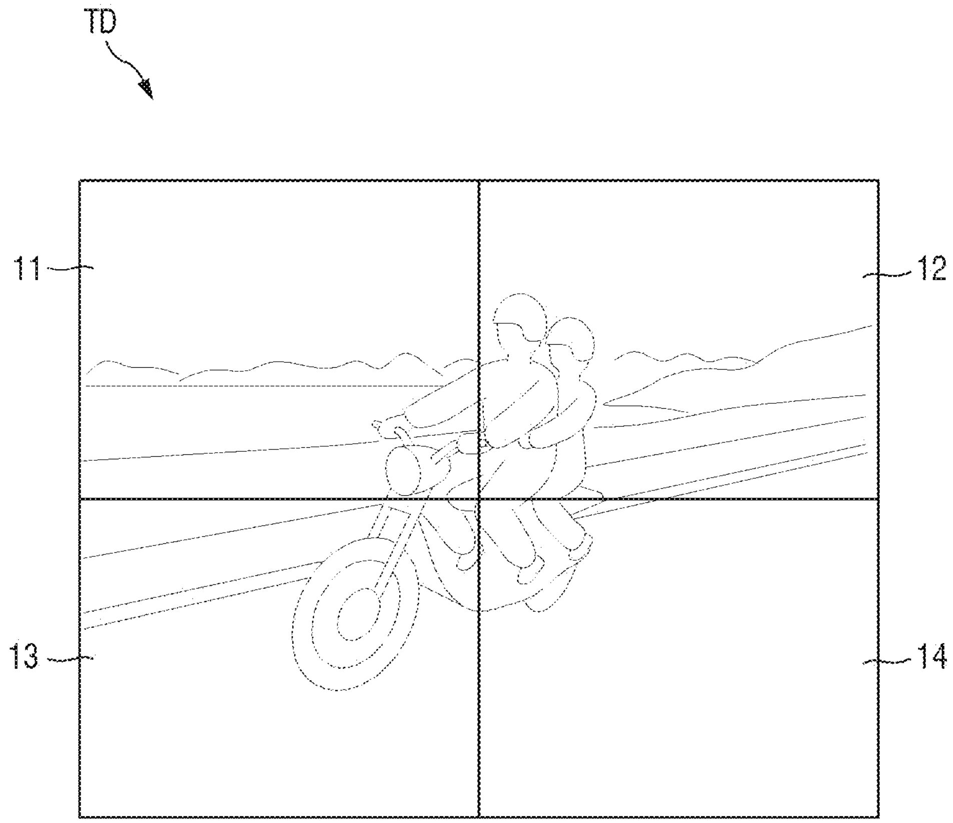
FIG. 23 is a diagram illustrating a state in which a tiled display device using a display device according to one or more embodiments is driven.

FIG. 22 is a block diagram illustrating a structure of a tiled display device according to one or more embodiments. FIG. 23 is a diagram illustrating a state in which a tiled display device using a display device according to one or more embodiments is driven.

Referring to FIGS. 22 and 23, the tiled display device TD 10 according to one or more embodiments may include a host system HOST, a broadcast tuner (e.g., broadcast tuning unit) 410 included in each of the plurality of display devices 11, 12, 13, and 14, a signal processor (e.g., signal-processing unit) 420, a display (e.g., display unit) 430, a speaker 440, a user interface (e.g., user input unit) 450, a hard disk drive (HDD) 460, a network communicator (network communication unit) 470, a UI generator 480, and a controller (e.g., control unit) 490. FIG. 21 illustrates the host system HOST and the first display device 11.

The host system HOST may be implemented as any one of a television system, a home theater system, a set-top box, a navigation system, a DVD player, a Blu-ray player, a personal computer (PC), a mobile phone system, and/or a tablet.

A user's command may be inputted to the host system HOST in various formats. For example, a command by a user's touch input may be inputted to the host system HOST. Alternatively, a user's command by a keyboard input or a button input of a remote controller may be inputted to the host system HOST.

The host system HOST may receive original video data corresponding to an original image from the outside. The host system HOST may divide the original video data by the number of the display devices 10. For example, in response to the first display device 11, the second display device 12, the third display device 13, and the fourth display device 14, the host system HOST may divide the original video data into a first video data corresponding to a first image, a second video data corresponding to a second image, a third video data corresponding to a third image, and a fourth video data corresponding to a fourth image. The host system HOST may transmit the first video data to the first display device 11, the second video data to the second display device 12, the third video data to the third display device 13, and the fourth video data to the fourth display device 14.

The first display device 11 may display the first image according to the first video data, the second display device 12 may display the second image according to the second video data, the third display device 13 may display the third image according to the third video data, and the fourth display device 14 may display the fourth image according to the fourth video data. Accordingly, the user may view the original image in which the first to fourth images displayed on the first to fourth display devices 11, 12, 13 and 14 are combined as shown in FIG. 22.

Each of the plurality of display devices 11, 12, 13, and 14 constituting the tiled display device TD may further include the broadcast tuner 410, the signal processor 420, the display 430, the speaker 440, the user interface 450, the HDD 460, the network communicator 470, the UI generator (e.g., UI generation unit) 480, and the controller 490. The components included in the plurality of display devices 11, 12, 13, and 14 are substantially the same. Therefore, hereinafter, for simplicity of description, the components included in the first display device 11 will be mainly described below, and the description of the components included in the second display device 12, the third display device 13, and the fourth display device 14 will be omitted.

The broadcast tuner 410 may tune a suitable channel frequency (e.g., a predetermined channel frequency) under the control of the controller 490 to receive a broadcast signal of a corresponding channel through an antenna. The broadcast tuner 410 may include a channel detector (e.g., channel detection module) and an RF demodulator (e.g., RF demodulation module).

The broadcast signal demodulated by the broadcast tuner 410 is processed by the signal processor 420 and outputted to the display 430 and the speaker 440. Here, the signal processor 420 may include a demultiplexer 421, a video decoder 422, a video processor (e.g., video processing unit) 423, an audio decoder 424, and an additional data processor 425.

The demultiplexer 421 separates the demodulated broadcast signal into a video signal, an audio signal, and additional data. The video signal, the audio signal, and the additional data are restored by the video decoder 422, the audio decoder 424, and the additional data processor 425, respectively. In this case, the video decoder 422, the audio decoder 424, and the additional data processor 425 restore them in a decoding format corresponding to an encoding format of when the broadcast signal is transmitted.

On the other hand, the decoded video signal is converted by the video processor 423 to fit the vertical frequency, resolution, aspect ratio, and the like that meet the output standard of the display 430, and the decoded audio signal is outputted to the speaker 440.

The display 430, which is a device for displaying an image, includes the pixel PX, the driver, and the like described above.

The user interface 450 may receive a signal transmitted by the host system HOST. The user interface 450 may be provided to allow the user to select channels transmitted by the host system HOST and select commands related to communication with other display devices 12 to 14 as well as data related to selection and manipulation of a user interface (UI) menu, and to allow data for input to be inputted.

The HDD 460 stores various software programs including OS programs, recorded broadcast programs, videos, photos, and other data, and may be formed of a storage medium such as a hard disk or non-volatile memory.

The network communicator 470 is for short-distance communication with the host system HOST and other display devices 12 to 14, and may be implemented with a communicator (e.g., communication module) including an antenna pattern that can implement mobile communication, data communication, Bluetooth, RF, Ethernet, and/or the like.

The network communicator 470 may transmit/receive a wireless signal to/from at least one of a base station, an external terminal, or a server on a mobile communication network constructed according to technical standards or communication methods (e.g., global system for mobile communication (GSM), code division multi access (CDMA), CDMA2000, enhanced voice-data optimized or enhanced voice-data only (EV-DO), wideband CDMA (WCDMA), high speed downlink packet access (HSDPA), high speed uplink packet access (HSUPA), long term evolution (LTE), long term evolution-advanced (LTE-A), 5G, and the like) for mobile communication through the antenna pattern to be described later.

The network communicator 470 may transmit/receive a wireless signal in a communication network according to wireless internet techniques through the antenna pattern to be described later. Examples of the wireless internet techniques include wireless LAN (WLAN), wireless-fidelity (Wi-Fi), Wi-Fi direct, digital living network alliance (DLNA), wireless broadband (WiBro), world interoperability for microwave access (WiMAX), high speed downlink packet access (HSDPA), high speed uplink packet access (HSUPA), long term evolution (LTE), long term evolution-advanced (LTE-A), and/or the like. The antenna pattern transmits and receives data according to at least one of wireless internet techniques including even internet techniques not listed above.

The UI generator 480 generates a UI menu for communication with the host system HOST and other display devices 12 to 14, and may be implemented by an algorithm code and an OSD IC. The UI menu for communication with the host system HOST and other display devices 12 to 14 may be a menu for designating a counterpart digital TV for communication and selecting a desired function.

The controller 490 is in charge of overall control of the first display device 11, and communication control of the host system HOST and the second to fourth display devices 12, 13, and 14. The controller 490 may be implemented by a microcontroller unit (MCU) in which a corresponding algorithm code for control is stored and the stored algorithm code is executed.

In response to the input and selection of the user interface 450, the controller 490 controls to transmit a corresponding control command and data to the host system HOST and the second to fourth display devices 12, 13, and 14 through the network communicator 470. When receiving a suitable control command (e.g., a predetermined control command) and data from the host system HOST and the second to fourth display devices 12, 13, and 14, the controller 490 performs an operation according to the corresponding control command.

In concluding the detailed description, those skilled in the art will appreciate that many variations and modifications can be made to the embodiments without substantially departing from the aspects and scope of the present disclosure. Therefore, the embodiments of the present disclosure are used in a generic and descriptive sense only and not for purposes of limitation.

What is claimed is:

1. A display device comprising:
a substrate;
a light-emitting element on a first surface of the substrate;
a driver on a second surface of the substrate opposite to the first surface, and configured to drive the light-emitting element;
a first pad on the first surface of the substrate, and electrically connected to the light-emitting element;
a second pad on the second surface of the substrate, and electrically connected to the driver;
side surface lines on a side surface of the substrate that is between the first surface and the second surface of the substrate, the side surface lines being configured to electrically connect the first pad to the second pad; and
an overcoat layer on the side surface of the substrate, and on the side surface lines,
wherein, in the overcoat layer, a thickness of a region not overlapping a side surface line from among the side surface lines is greater than a thickness of a region overlapping the side surface line.

2. The display device of claim 1, wherein the overcoat layer contacts the side surface of the substrate between the side surface lines, and contacts top and side surfaces of the side surface lines.

3. The display device of claim 1, wherein the overcoat layer has a first thickness in the region not overlapping a side surface line from among the side surface lines, and has a second thickness that is less than the first thickness in the region overlapping the side surface line.

4. The display device of claim 1, wherein the first thickness of the overcoat layer is a distance from the side surface of the substrate to a top surface of the overcoat layer, and the second thickness of the overcoat layer is a distance from a top surface of the side surface line to the top surface of the overcoat layer.

5. The display device of claim 3, wherein the first thickness of the overcoat layer is greater than a sum of a thickness of the side surface line and the second thickness of the overcoat layer.

6. The display device of claim 3, wherein a level difference of the overcoat layer is in a range of about 1 μm to about 10 μm, and
wherein the level difference of the overcoat layer is a difference between the first thickness of the overcoat layer and a sum of a thickness of the side surface line and the second thickness of the overcoat layer.

7. The display device of claim 1, wherein a distance from the side surface of the substrate to a top surface of the overcoat layer in the region not overlapping a side surface line from among the side surface lines is greater than a distance from the side surface of the substrate to the top surface of the overcoat layer in the region overlapping the side surface line.

8. The display device of claim 1, wherein a distance from the side surface of the substrate to the top surface of the overcoat layer in the region not overlapping the side surface line is equal to a distance from the side surface of the substrate to the top surface of the overcoat layer in the region overlapping the side surface line.

9. The display device of claim 1, wherein, in the overcoat layer, the region not overlapping a side surface line from among the side surface lines protrudes more outwardly than the region overlapping the side surface line.

10. The display device of claim 1, wherein the substrate further comprises:
a first chamfered surface extending from one side of the first surface; and
a second chamfered surface extending from one side of the second surface,
wherein the side surface connects the first chamfered surface to the second chamfered surface.

11. The display device of claim 10, wherein a side surface line from among the side surface lines is on the first surface, the first chamfered surface, the side surface, the second chamfered surface, and the second surface.

12. The display device of claim 10, wherein a side surface line from among the side surface lines comprises silver (Ag).

13. A display device comprising:
a substrate;
a light-emitting element on a first surface of the substrate;
a driver on a second surface of the substrate opposite to the first surface, and configured to drive the light-emitting element;
a first pad on the first surface of the substrate, and electrically connected to the light-emitting element;
a second pad on the second surface of the substrate, and electrically connected to the driver;
side surface lines on a side surface of the substrate between the first surface and the second surface of the substrate, the side surface lines being configured to electrically connect the first pad to the second pad;
a first overcoat layer on the side surface of the substrate, and on the side surface lines; and
a second overcoat layer on the first overcoat layer.

14. The display device of claim 13, wherein a thickness of the first overcoat layer is greater than a thickness of a side surface line from among the side surface lines, and a top surface of the first overcoat layer is flat.

15. The display device of claim 13, wherein the second overcoat layer comprises a material that is different from a material of the first overcoat layer.

16. The display device of claim 15, wherein the first overcoat layer comprises a polyimide or polyacrylate resin.

17. The display device of claim 15, wherein the second overcoat layer comprises a black pigment and a filler, and
wherein the first overcoat layer does not comprise the black pigment and the filler.

18. A tiled display device comprising display devices and a seam between the display devices,
wherein at least one display device from among the display devices comprises:
a substrate;
a light-emitting element on a first surface of the substrate;
a driver on a second surface of the substrate opposite to the first surface, and configured to drive the light-emitting element;
a first pad on the first surface of the substrate, and electrically connected to the light-emitting element;
a second pad on the second surface of the substrate, and electrically connected to the driver;
side surface lines on a side surface of the substrate between the first surface and the second surface of the substrate, the side surface lines being configured to electrically connect the first pad to the second pad; and
an overcoat layer on the side surface of the substrate, and on the side surface lines,
wherein, in the overcoat layer, a thickness of a region not overlapping the side surface line is greater than a thickness of a region overlapping the side surface line.

19. The tiled display device of claim 18, wherein the light-emitting element comprises a micro light-emitting diode of a flip chip type.

20. The tiled display device of claim 18, wherein the at least one display device further comprises:

a bottom surface connection line on the second surface of the substrate and connected to the second pad; and a flexible film connected to the bottom surface connection line through a conductive adhesive.

21. The tiled display device of claim 18, wherein the display devices are arranged in a matrix form in M rows and N columns, M and N being respective natural numbers.

* * * * *